(12) United States Patent
Abouda et al.

(10) Patent No.: US 11,057,073 B2
(45) Date of Patent: Jul. 6, 2021

(54) INTEGRATED CIRCUIT WITH PHYSICAL LAYER INTERFACE CIRCUIT

(71) Applicant: NXP USA, Inc., Austin, TX (US)

(72) Inventors: Pascal Kamel Abouda, Saint Lys (FR); Alexis Nathanael Huot-Marchand, Labastidette (FR); Matthieu Aribaud, Tournefeuille (FR)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/879,280

(22) Filed: May 20, 2020

(65) Prior Publication Data
US 2020/0373959 A1 Nov. 26, 2020

(30) Foreign Application Priority Data
May 24, 2019 (EP) ..................................... 19305662

(51) Int. Cl.
*H04B 1/40* (2015.01)
*H03H 7/38* (2006.01)
*H04B 3/02* (2006.01)

(52) U.S. Cl.
CPC .............. *H04B 1/40* (2013.01); *H03H 7/383* (2013.01); *H04B 3/02* (2013.01)

(58) Field of Classification Search
CPC . H04B 1/38; H04B 1/40; H04B 1/586; H04B 3/02; H04B 3/28; H04B 3/30;
(Continued)

(56) References Cited

U.S. PATENT DOCUMENTS

| 7,885,047 | B2 | 2/2011 | Deval et al. |
| 2009/0017772 | A1* | 1/2009 | Kemmochi ............ H04B 1/006 455/73 |

(Continued)

FOREIGN PATENT DOCUMENTS

EP 3 214 803 A1 9/2017

OTHER PUBLICATIONS

"Fontana, M. et al. "BCI—DPI Susceptibility Tests on CAN Networks at Equipment Level", 17 Colloque International et Exposition sur la Compatibilite ElectroMagnetique (CEM 2014), 4 pgs., retrieved from the internet at: URL:http://citeseerx.ist.psu.edu/viewdoc/download?doi=10.1.1.718.7026&rep=rep1&type=pdf (2014)".

(Continued)

*Primary Examiner* — Young T. Tse
(74) *Attorney, Agent, or Firm* — Rajeev Madnawat

(57) ABSTRACT

An integrated circuit for use in a differential network bus node comprising: a transceiver having a first transceiver input-output terminal and a second transceiver input-output terminal; a physical layer high terminal connected to the first transceiver input-output-terminal; a physical layer low terminal connected to the second transceiver input-output terminal; and a physical layer interface circuit comprising: a first low frequency RC matching circuit and a first high frequency RC matching circuit each connected between the first transceiver input-output-terminal and a first reference terminal; and a second low frequency RC matching circuit and a second high frequency RC matching circuit each connected between the second transceiver input-output terminal and a second reference terminal.

15 Claims, 20 Drawing Sheets

(58) Field of Classification Search
CPC . H04B 3/54; H03H 7/38; H03H 7/383; H03H 7/422
USPC ............... 375/219, 220, 257; 370/257, 258; 326/30, 86, 88; 333/123, 124, 25, 32, 333/172
See application file for complete search history.

(56) References Cited

U.S. PATENT DOCUMENTS

| | | | |
|---|---|---|---|
| 2012/0249257 A1 | 10/2012 | Takahashi et al. | |
| 2016/0329921 A1* | 11/2016 | Jussila | H03B 27/00 |
| 2017/0155362 A1* | 6/2017 | Selvanayagam | H03K 5/1565 |
| 2019/0132159 A1 | 5/2019 | Frey et al. | |

OTHER PUBLICATIONS

"Integrated circuits—EMC evaluation of transceivers—Part 3: CAN transceivers—Edition 1.0", IEC 62228-3, International Electrotechnical Commission Marque deposee de la Commission Electrotechnique Internationale, 160 pgs. Retrieved from the internet Mar. 11, 2019 at: URL:URL:ftp://standard.iec.ch/iec62228-3{ed1.0}b.pdf.

* cited by examiner ic layer (like CAN (Controller Area Network), Flexray, etc.) have to pass an immunity specification. For example, IEC 62228-3:2019 specifies test and measurement methods for EMC (electromagnetic compatibility) evaluation of CAN transceiver ICs (integrated circuits) under network conditions. Specific tests include immunity against RF disturbances, impulses and ESD (electrostatic discharges).

INTEGRATED CIRCUIT WITH PHYSICAL LAYER INTERFACE CIRCUIT

CROSS-REFERENCE TO RELATED APPLICATIONS

This application claims the priority under 35 U.S.C. § 119 of European Patent application no. 19305662.9, filed on May 24, 2019, the contents of which are incorporated by reference herein.

FIELD

The present disclosure relates to integrated circuits and in particular to integrated circuits used in differential network bus nodes.

BACKGROUND

Differential network components implementing a physical layer (like CAN (Controller Area Network), Flexray, etc.) have to pass an immunity specification. For example, IEC 62228-3:2019 specifies test and measurement methods for EMC (electromagnetic compatibility) evaluation of CAN transceiver ICs (integrated circuits) under network conditions. Specific tests include immunity against RF disturbances, impulses and ESD (electrostatic discharges).

Standard specifications can require transceiver ICs to be tested with and without connection to an external CMC (common mode choke). A 100 uH CMC together with the equivalent capacitance of the IC can generate a low frequency resonance around 4 MHz. This low frequency resonance can cause an increase in power injected into the IC during DPI (direct power injection) tests. This can lead to failure of a receiver part of the IC during DPI if the common mode rejection ratio is not high enough at this resonance frequency.

The latest edition of standard specification IEC62228-3:2019 implements technical changes including testing physical layers with only two CAN nodes (two CAN transceivers). This minimal CAN network with only two nodes can reduce the equivalent capacitance of the CAN bus causing a further increase in the amount of power injected on the ICs. This can result in reduced EMC performance of the IC, particularly at high frequencies, on both CAN versions 500 KB and FD (2 MB) (Flexible Data Rate).

SUMMARY

According to a first aspect of the present disclosure there is provided an integrated circuit for use in a differential network bus node, the integrated circuit comprising:
  a transceiver having a first transceiver input-output terminal and a second transceiver input-output terminal;
  a physical layer high terminal connected to the first transceiver input-output-terminal;
  a physical layer low terminal connected to the second transceiver input-output terminal; and
  a physical layer interface circuit comprising:
    a first low frequency RC matching circuit and a first high frequency RC matching circuit each connected between the first transceiver input-output-terminal and a first reference terminal; and
    a second low frequency RC matching circuit and a second high frequency RC matching circuit each connected between the second transceiver input-output terminal and a second reference terminal.

The physical layer interface circuits can improve the immunity performance of a physical layer. The interface circuits provide integrated matching networks that can be optimized to: (i) shift a low frequency resonance to lower frequencies while dumping its quality factor; and (ii) decrease high frequency impedance to decrease the level of power injected into the IC.

In one or more embodiments, the integrated circuit may further comprise a pad ring. The physical layer interface circuit may be positioned in the pad ring.

In one or more embodiments, the physical layer high terminal may be connected to the first transceiver input-output-terminal by:
  a first bond wire connected between the physical layer high terminal and a first bond pad; and
  one or more first conductive paths connecting the first bond pad, the first transceiver input-output terminal and the first RC matching circuits.

The physical layer low terminal may be connected to the second transceiver input-output-terminal by:
  a second bond wire connected between the physical layer low terminal and a second bond pad; and
  one or more second conductive paths connecting the second bond pad, the second transceiver input-output terminal and the second RC matching circuits.

In one or more embodiments, the first low frequency RC matching circuit may comprise a first low frequency resistance in series with a first low frequency capacitance. The second low frequency RC matching circuit may comprise a second low frequency resistance in series with a second low frequency capacitance. The first high frequency RC matching circuit may comprise a first high frequency resistance in series with a first high frequency capacitance. The second high frequency RC matching circuit may comprise a second high frequency resistance in series with a second high frequency capacitance.

In one or more embodiments, the first low frequency resistance and the second low frequency resistance may have values between 2 kOhms and 200 kOhms. The first low frequency capacitance and the second low frequency capacitance may have values between 1 and 5 pF. The first high frequency resistance and the second high frequency resistance may have values between 5 and 100 Ohms. The first high frequency capacitance and the second high frequency capacitance may have values between 1 and 10 pF.

In one or more embodiments, the first low frequency RC matching circuit may be the same as the second low frequency RC matching circuit and the first high frequency matching circuit may be the same as the second high frequency matching circuit.

In one or more embodiments, the physical layer terminals may be configured to be connected to an external common mode choke and a network bus.

In one or more embodiments, an inductance of the common mode choke and a capacitance of the integrated circuit may define a low frequency resonance. Values of the first low frequency resistance, second low frequency resistance, first low frequency capacitance and second low frequency capacitance may be based on the low frequency resonance.

In one or more embodiments, the values of the first low frequency resistance and second low frequency resistance may be selected to reduce a quality factor of the low frequency resonance.

In one or more embodiments, the values of the first low frequency capacitance and second low frequency capacitance may be selected to reduce a frequency of the low frequency resonance.

In one or more embodiments, the values of the first high frequency resistance, second high frequency resistance, first high frequency capacitance and second high frequency capacitance may be selected to reduce RF oscillations.

In one or more embodiments, the integrate circuit may further comprise a processing circuit and a node controller. The transceiver, processing circuit and node controller may not be positioned within the PAD ring.

According to a further aspect of the present disclosure, there is provided a differential bus node comprising any of the integrated circuits disclosed herein.

In one or more embodiments, the differential network bus node may be one of:
a controller area network node;
a Flexray network node; or
a DSI network node.

In one or more embodiments, the differential network bus node may further comprise a common mode choke, wherein:
an inductance of the common mode choke and a capacitance of the integrated circuit may define a low frequency resonance; and
values of the first low frequency resistance, second low frequency resistance, first low frequency capacitance and second low frequency capacitance may be based on the low frequency resonance.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

Figure 1:
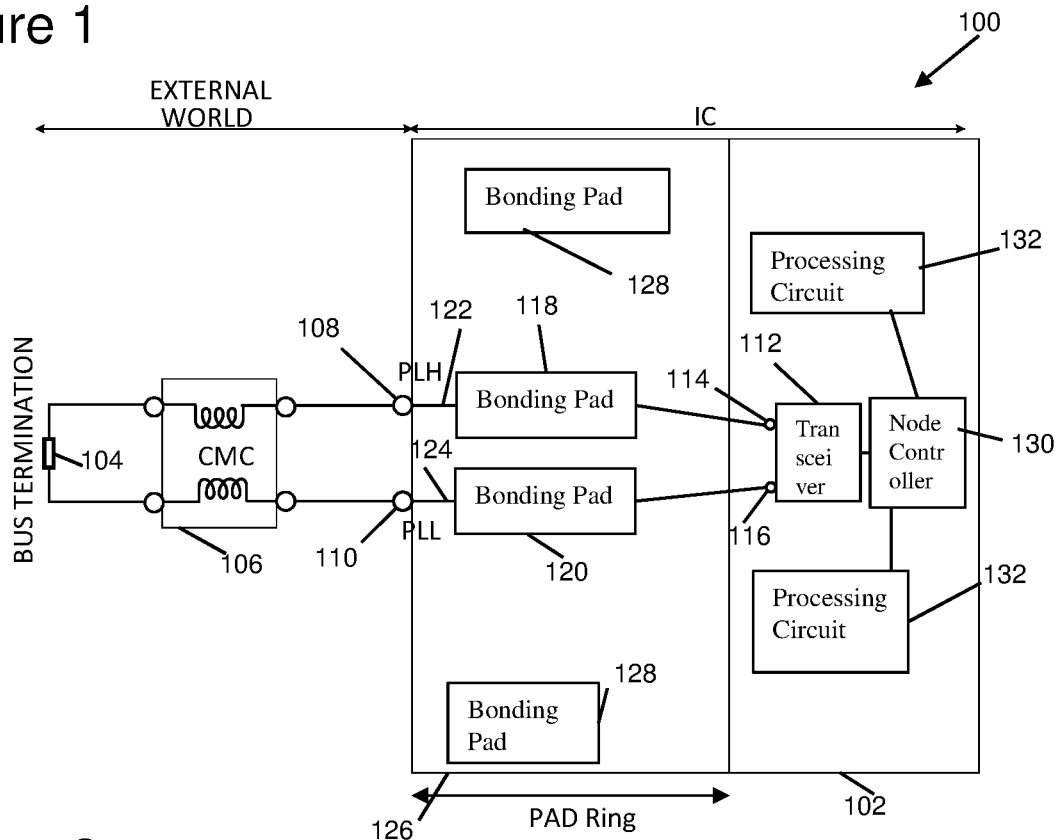
FIG. 1 shows schematic diagram of an example differential network bus node.

FIG. 1 shows a schematic diagram of an example differential network bus node 100. The differential network bus node 100 comprises an integrated circuit (IC) 102 connected to a bus termination 104. The bus termination 104 may comprise a connection to a network bus (not shown) which may be connected to further differential network bus nodes. In this example, the IC 102 is connected to the bus termination 104 via a common mode choke (CMC) 106. The connection to the IC 102 is made at a physical-layer-high-terminal 108 and a physical-layer-low-terminal 110 of the integrated circuit 102. In some examples, the physical-layer-high-terminal 108 and the physical-layer-low-terminal 110 may each comprise a connection pin on a package of the IC 102.

The IC 102 comprises a transceiver 112 having a first-transceiver-input-output-node 114 and a second-transceiver-input-output-node 116. The first-transceiver-input-output-node 114 is connected to the physical-layer-high-terminal 108. The second-transceiver-input-output-node 116 is connected to the physical-layer-low-terminal 110.

In the example of FIG. 1, the connections between the transceiver nodes 114, 116 and the physical layer terminals 108, 110 are via respective first and second bonding pads 118, 120 and first and second bonding wires 122, 124. The bonding pads 118, 120 and bonding wires 122, 124 can enable connection to physical layer terminals 108, 110 implemented as connection pins on a package of the IC 102. The bonding pads 118, 120 are positioned in a PAD ring 126 of the IC 102. The PAD ring may comprise further bonding pads 128 providing connections between other pins of the package and other components of the IC. The PAD ring 126 may further comprise other circuitry (not shown) such as ESD protection circuitry, power lines/rings and protection diodes.

The IC 102 of the network node 100 further comprises a node controller 130, for controlling the transceiver 112, and processing circuitry 132 which may implement the main functionality of the network node 100. In automotive CAN nodes, examples of main functionality can include functionality related to transmission, airbags, antilock braking, electric power steering, window lift and audio-visual (AV) systems, among others. Each of these systems may comprise multiple subsystems. Each subsystem may correspond to a CAN node or a microcontroller (processing circuitry) within a node. For example, a braking circuit may have power supply units supplying several microcontrollers within a vehicle for valve control, general purpose I/O, temperature sensing etc. AV systems can require a higher bit rate CAN.

Figure 2:
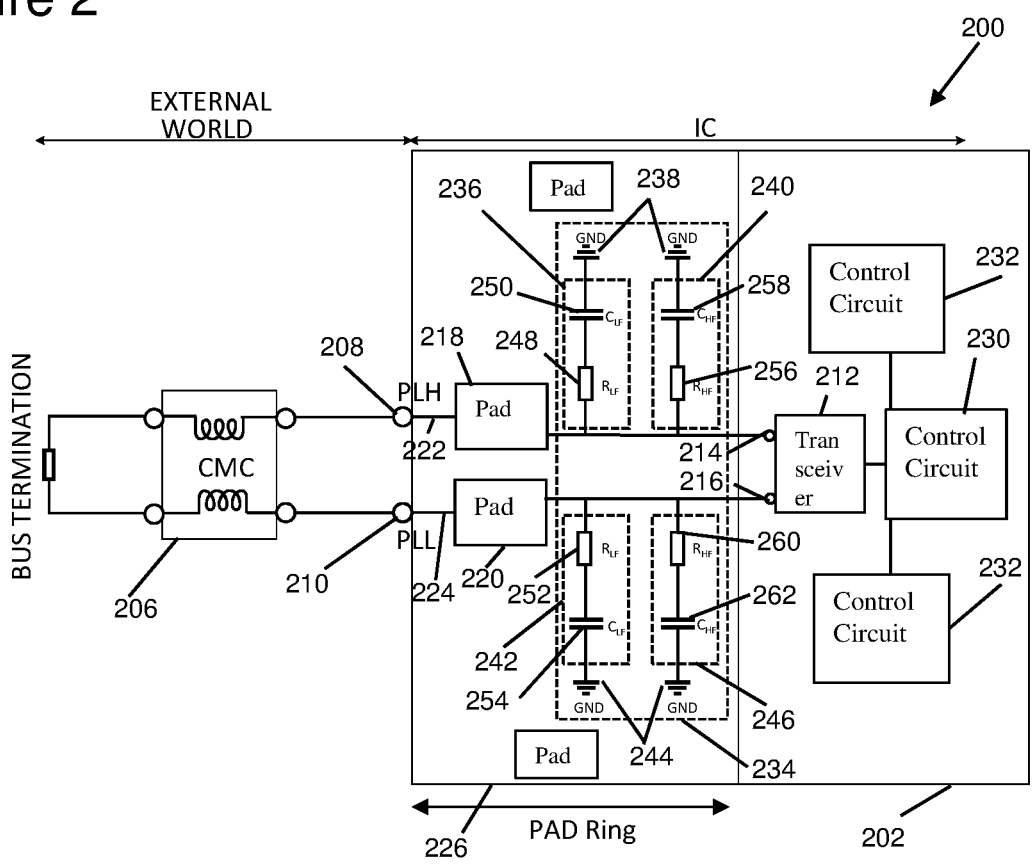
FIG. 2 illustrates a schematic diagram of a differential network bus node comprising an IC according to an example embodiment.

FIG. 2 illustrates a schematic diagram of a differential network bus node 200 comprising an IC 202 according to an embodiment of the present disclosure. Features of FIG. 2 that are also shown in FIG. 1 have been given corresponding reference numbers in the 200 series and will not necessarily be described again here.

The IC 202 comprises a physical layer interface circuit 234 comprising: a first low frequency RC matching circuit 236 connected between the first transceiver input-output-terminal 214 and a first reference terminal 238; a first high frequency RC matching circuit 240 connected between the first transceiver input-output-terminal 214 and the first reference terminal 238; a second low frequency RC matching circuit 242 connected between the second transceiver input-output terminal 216 and a second reference terminal 244; and a second high frequency RC matching circuit 246 connected between the second transceiver input-output terminal 216 and a second reference terminal 244. In some examples, the first reference terminal 238 and the second reference terminal 244 are connected to the same voltage reference, such as a network node reference, which may be ground.

In this example, the physical layer interface circuit 234 is positioned in the PAD ring 226 of the IC 202. The connection between the first RC matching circuits 236, 240, the first transceiver input-output terminal and the first physical layer high terminal 208 comprises: (i) one or more first conductive paths connecting the first RC matching circuits 236, 240, the first transceiver input-output terminal 214 and a first bonding pad 218; and (ii) a first bonding wire 222 connected between the first bonding pad 218 and the physical layer high terminal 208. Similarly, the connection between the second RC matching circuits 242, 246 and physical layer low terminal 210 comprises: (i) one or more second conductive paths connecting the second RC matching circuits 236, 240, the second transceiver input-output terminal 216 and a second bonding pad 220; and (ii) a second bonding wire 224 between the second bonding pad 220 and the physical layer low terminal 210. The one or more first and second conductive paths may be one or more metal layers or connections within the IC.

Locating the physical layer interface circuits 234 in the PAD ring can avoid increasing the die size of the IC and avoid big changes in IC architecture that fit specification for items outside EMC. In other words, the disclosed physical layer interface circuits can be implemented on existing IC designs without re-verification of the main transceiver and processing circuitry of the IC.

The first low frequency RC matching circuit 236 comprises a first low frequency resistor $R_{LF}$ 248 in series with a first low frequency capacitor $C_{LF}$ 250. The second low frequency RC matching circuit 242 comprises a second low frequency resistor $R_{LF}$ 252 in series with a second low frequency capacitor $C_{LF}$ 254. The first high frequency RC matching circuit 240 comprises a first high frequency resistor $R_{HF}$ 256 in series with a first high frequency capacitor $C_{HF}$ 258. The second high frequency RC matching circuit 246 comprises a second high frequency resistor $R_{HF}$ 260 in series with a second high frequency capacitor $C_{HF}$ 262.

As described above, the interaction of the inductance of the CMC 206 and the equivalent capacitance of the IC 202 can generate a low frequency resonance of a few MHz. The physical layer interface circuit 234 can shift the resonance to a lower frequency and reduce its quality factor. Specifically, the first and second low frequency capacitors 250, 254 of the respective first and second low frequency RC matching circuits 236, 242 reduce the resonance frequency. The size of the shift in resonance frequency is dependent upon the value of the capacitors 250, 254. The first and second low frequency resistors 248, 252 reduce the quality factor of the resonance, and their values can be selected accordingly.

The first and second low frequency capacitors 250, 254 may have capacitance values in the range of 1 to 5 pF. In some examples, the first and second low frequency capacitors 250, 254 both have a value of 3 pF. The first and second low frequency resistors 248, 252 may have resistance values within the range 2 kΩ to 200 kΩ. In some examples, the first and second low frequency resistors 248, 252 both have a resistance value of 20 kΩ.

As described above, the recent change in the standard specification IEC62228-3:2019 to specify DPI testing with only two CAN transceiver ICs/nodes results in a reduction in capacitance of the associated CAN bus. The resulting increase in impedance can cause increased power injection to the IC during DPI testing leading to performance issues at high frequencies, particularly in the range 100-300 MHz. The physical layer interface circuit 234 can advantageously reduce the impedance and decrease the level of power injected into the transceiver 212 and the remaining processing and control circuitry 230, 232 of the IC 202.

The physical layer interface circuits can provide a low impedance path to ground for any high frequency signals, thus reducing power injected into the transceiver and processing circuitry. Specifically, the first and second high frequency matching circuits 240, 246 increase the capacitance of the bus node 200 via their respective first and second high frequency capacitors 258, 262. The first and second high frequency resistors 256, 260 can also enable impedance matching and reduce the quality factor of any high frequency resonances and their values can be selected accordingly. For unterminated nodes in a vehicle, the high frequency resistors 256, 260 together with the high frequency capacitors 258, 262 can form a termination impedance. For example, a high frequency matching circuit having a 50Ω high frequency resistor and 7 pF high frequency capacitor will have an impedance of approximately 120Ω at 300 MHz, corresponding to the bus termination impedance of a CAN network.

The first and second high frequency capacitors 258, 262 may have capacitance values within the range 1 to 20 pF. In some examples, the first and second high frequency capacitors 258, 262 both have a value of 7 pF. The first and second high frequency resistors 256, 260 may have resistance values within the range 5 to 100Ω. In some examples, the first and second high frequency resistors 256, 260 both have a resistance value of 50Ω.

By appropriate selection of the relevant resistance and capacitive values to address the above issues, the matching circuits 236, 243, 240, 246 may be considered as optimised RC matching networks.

Figure 3:
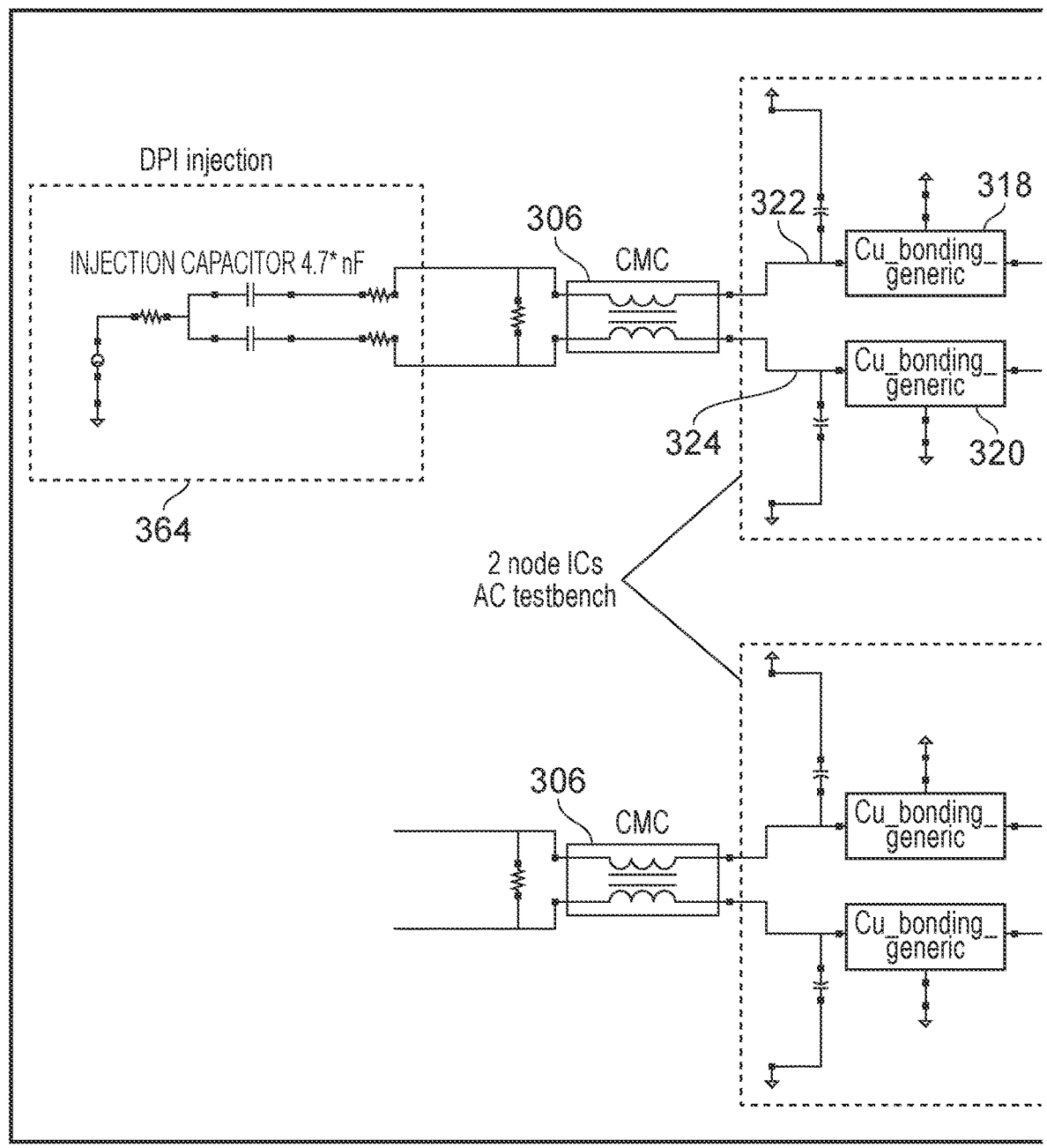
FIG. 3 illustrates an AC simulation bench circuit schematic for simulating DPI testing of a CAN bus consisting of only two exemplary CAN bus nodes.
Figure 3:
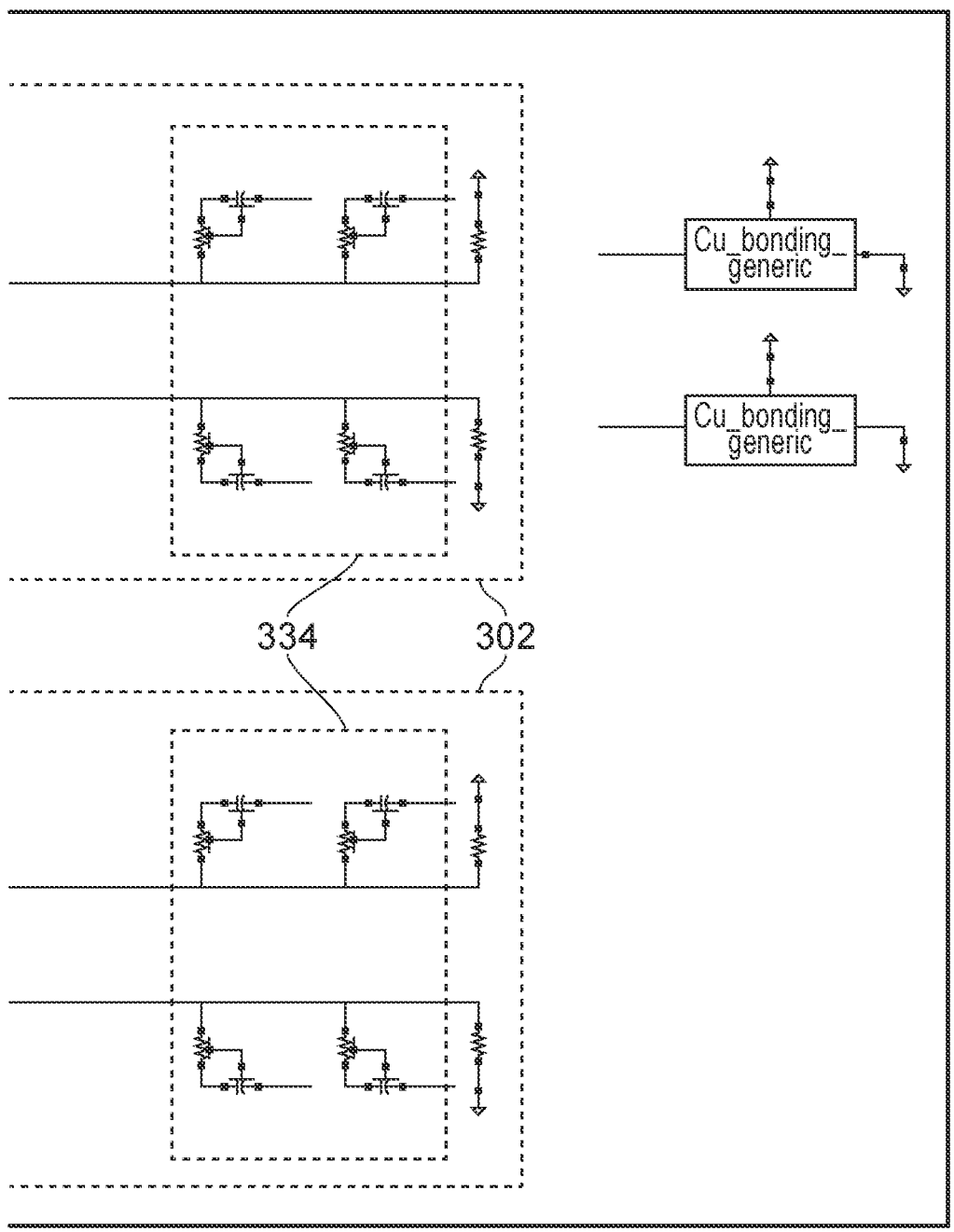

FIG. 3 illustrates an AC simulation bench circuit schematic for simulating DPI testing of a CAN bus consisting of only two CAN bus nodes. Features of FIG. 3 that are also shown in FIGS. 1 and 2 have been given corresponding reference numbers in the 300 series and will not necessarily be described again here.

Each CAN bus node comprises an IC 302 connected to a CMC 306. Each IC 302 comprises a physical layer interface circuit 334 as described above in relation to FIG. 2. A DPI injection circuit 364 is connected to the upper CMC 306. The two CAN bus nodes are connected via a CAN bus (not shown).

Figure 4:
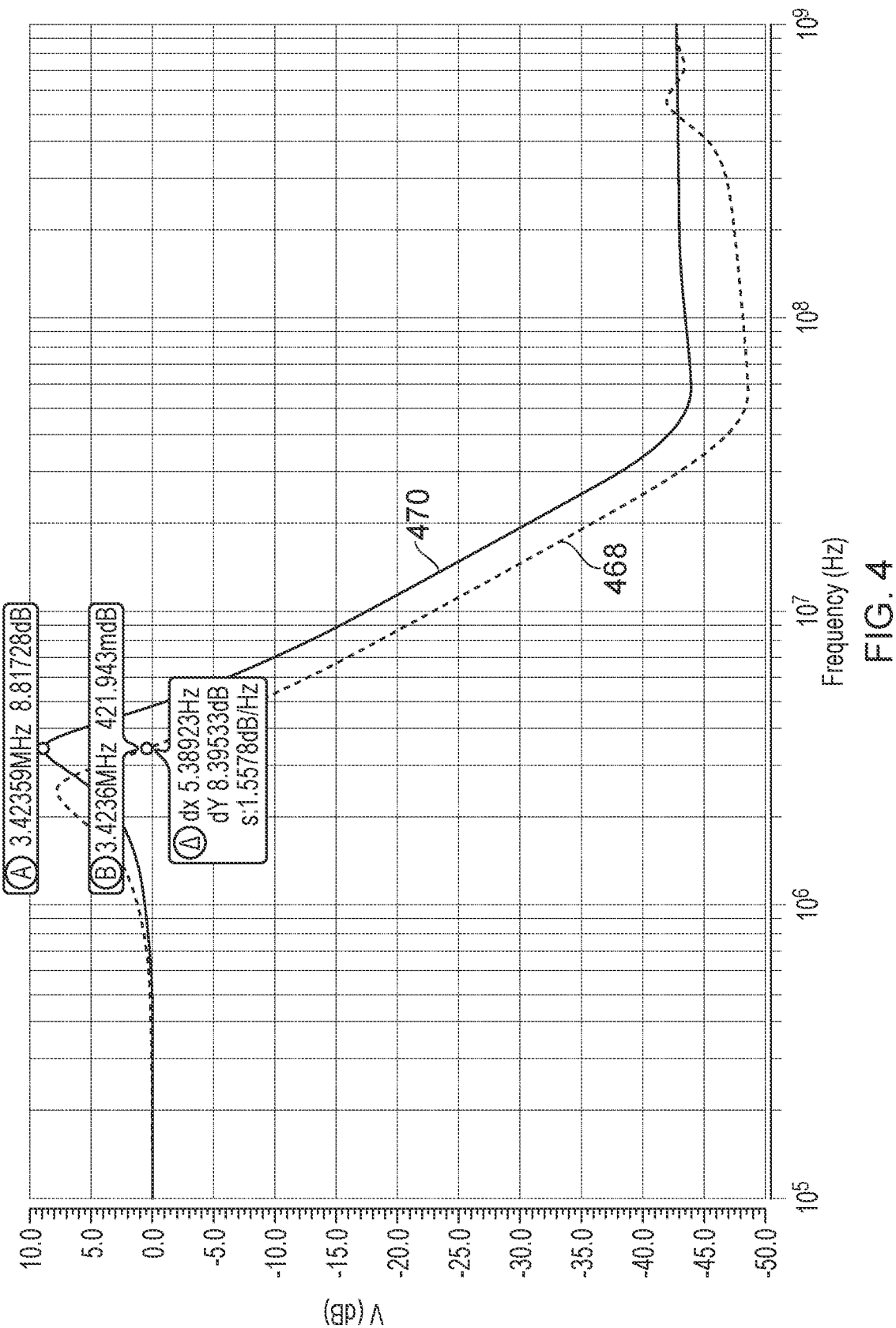
FIG. 4 illustrates the performance of the simulated DPI testing of the CAN bus nodes of FIG. 3.

FIG. 4 illustrates the performance of the simulated DPI testing of two different CAN bus node arrangements: (i) the CAN bus nodes of FIG. 3 with the physical layer interface circuits; and (ii) the same arrangement without the physical layer interface circuits (similar to that shown in FIG. 1). An optimised curve 468 shows the variation in voltage response (transfer function) to an AC signal injected in common mode by the DPI injection circuit, as a function of frequency for the CAN bus nodes with the physical layer interface circuits. An unoptimised curve 470 shows the variation in voltage response as a function of frequency for the CAN bus nodes without the physical layer interface circuits. The response is simulated at a point immediately to the right of the bonding pads in FIG. 3.

As described above, the interaction of the inductance of the CMC and the capacitance of the IC can result in a low frequency resonance at a few MHz. In this example, the resonance occurs at 3.4 MHz for the CAN bus nodes without the physical layer interface circuits. This can be seen as a peak in the unoptimised curve 470 at 3.4 MHz.

The physical layer interface circuits in the CAN bus nodes act to shift the resonance to a lower frequency and reduce its quality factor. Specifically, the first low frequency RC matching circuit and the second low frequency RC matching circuit reduce the resonance frequency by approximately 1 MHz, as illustrated by the peak in the optimised curve 468. In this example, the first and second low frequency capacitors both have a capacitance value of 3 pF which reduces the resonance frequency. First and second low frequency 20 kΩ resistors act to reduce the quality factor of the resonance.

The optimised curve 368 illustrates an 8.4 dB improvement in voltage attenuation at 3.4 MHz relative to the unoptimized curve 470. The physical layer interface circuits therefore reduce the power injected into the IC at 3.4 Mhz, the unoptimized resonance frequency.

Figure 5:
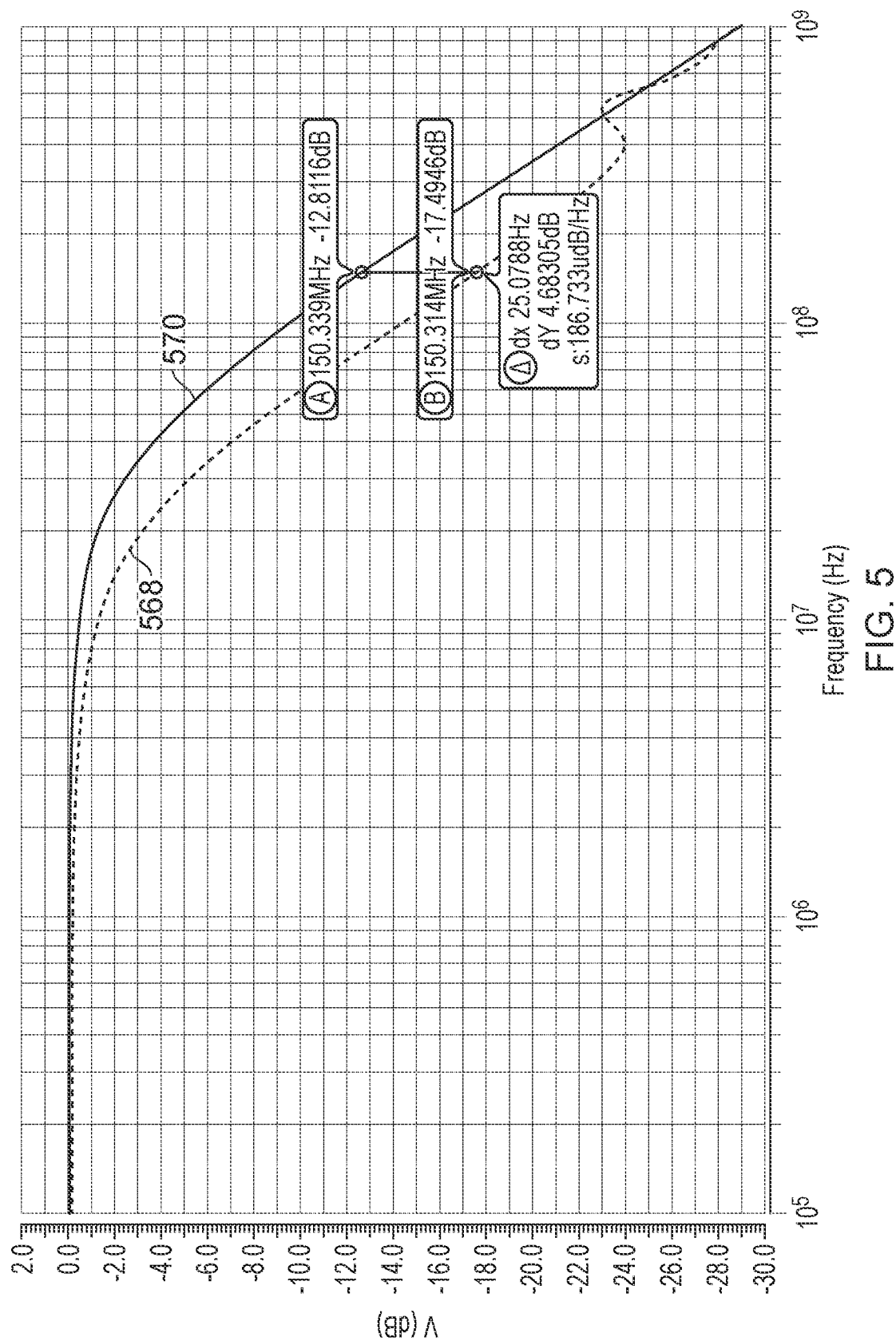
FIG. 5 illustrates the performance of the simulated DPI testing of the CAN bus nodes of FIG. 3 in the absence of CMCs.

FIG. 5 illustrates the same simulated performance curves 568, 570 as FIG. 4 but in the absence of the CMCs of the bus nodes.

As described above, the recent change in the standard specification IEC62228-3:2019 to specify DPI testing with only two CAN transceiver ICs/nodes results in a reduction in capacitance of the CAN bus. The resulting increase in impedance can cause increased power injection to the IC during testing leading to performance issues at high frequencies, particularly in the range 100-300 MHz. The performance issues can be more acute when the node ICs are not connected to CMCs (as discussed in relation to FIGS. 6 to 12 below). The physical layer interface circuits of FIGS. 2 and 3 can reduce the impedance and decrease the level of power injected into the transceiver and the processing and control circuitry of the IC. Specifically, the first and second high frequency matching circuits increase the capacitance of the CAN bus nodes via their respective first and second high frequency capacitors. The first and second high frequency resistors can also enable impedance matching and reduce the quality factor of any high frequency resonances.

Optimised curve 568 shows a 4.6 dB improvement in voltage attenuation across the frequency range 100-300 MHZ relative to the unoptimised curve 570. In other words, at high frequencies, the physical layer interface circuits reduce the level of power injected into the transceiver and the remainder of the IC.

FIGS. 6 to 13 show DPI performance results of a two node CAN bus physical layer with and without an optimised physical interface circuit. The individual figures show DPI results for various configurations as outlined in Table 1, where CW is continuous-wave and AM is amplitude modulation.

Figure 6:
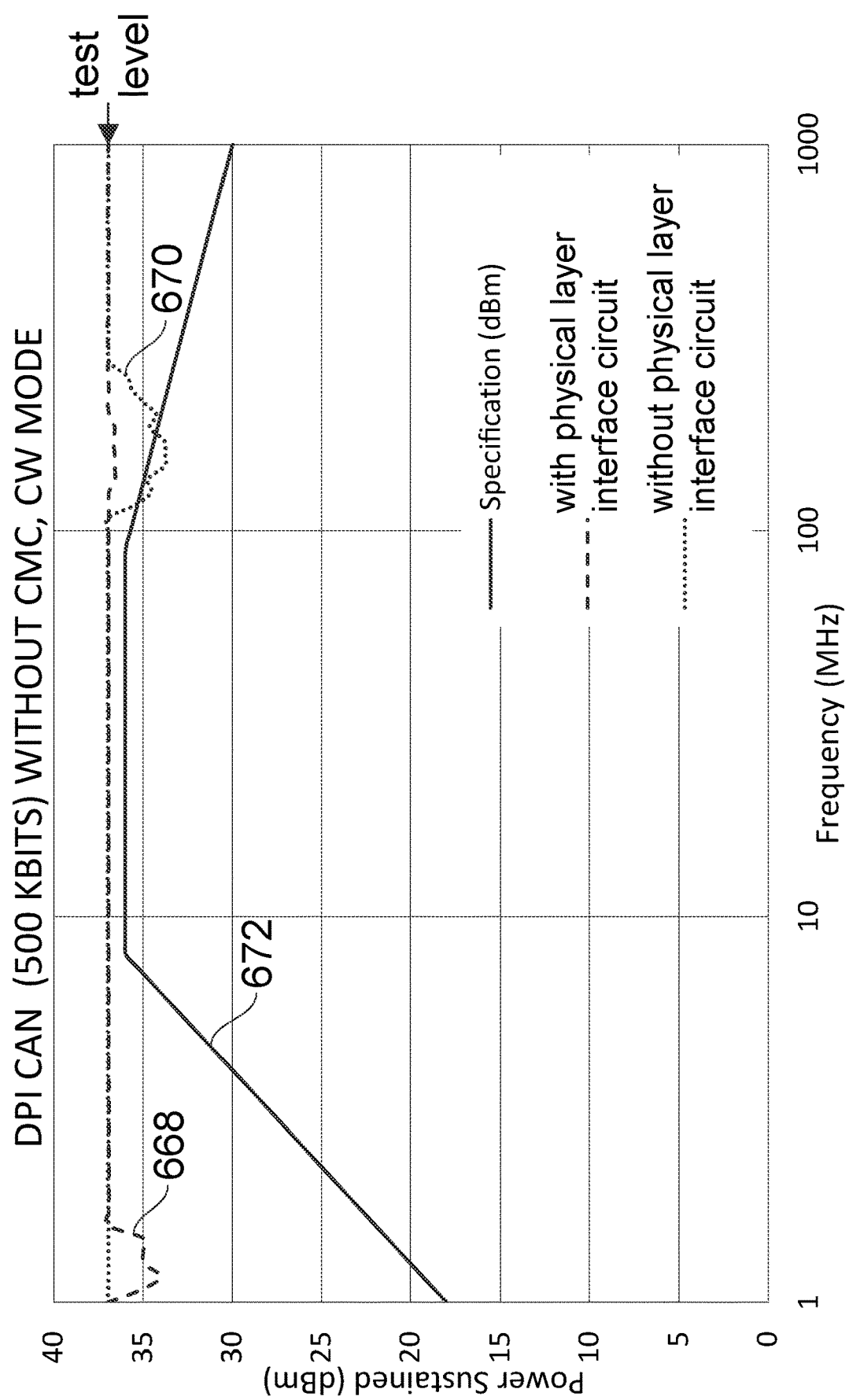
FIG. 6 shows DPI performance results of a two node 500 KB CAN bus physical layer with and without an optimised physical layer interface circuit according to an example embodiment, operating in CW mode, without CMGs.
Figure 7:
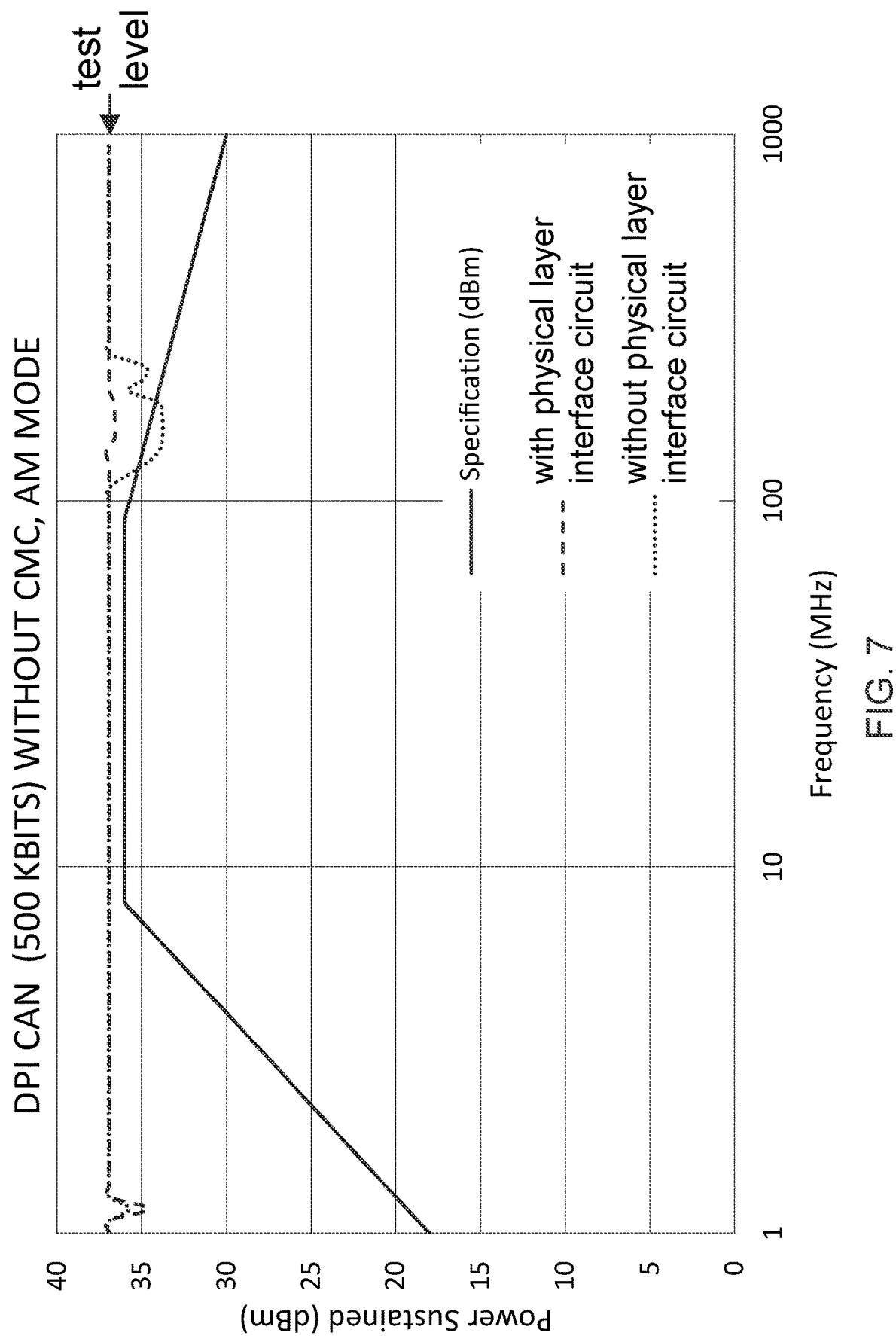
FIG. 7 shows DPI performance results of a two node 500 KB CAN bus physical layer with and without an optimised physical layer interface circuit according to an example embodiment, operating in AM mode, without CMCs.
Figure 8:
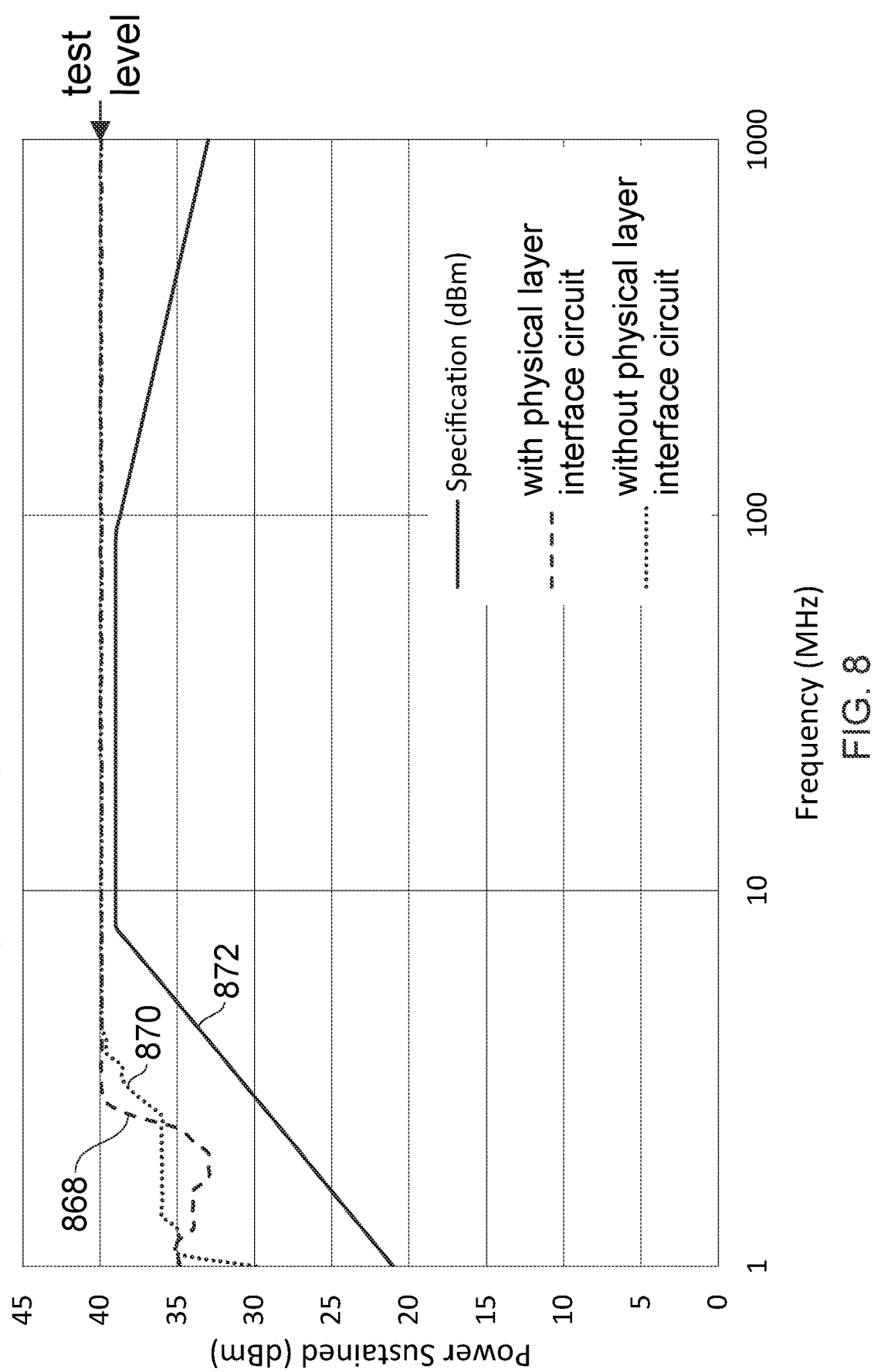
FIG. 8 shows DPI performance results of a two node 500 KB CAN bus physical layer with and without an optimised physical layer interface circuit, operating in CW mode, with CMCs.
Figure 9:
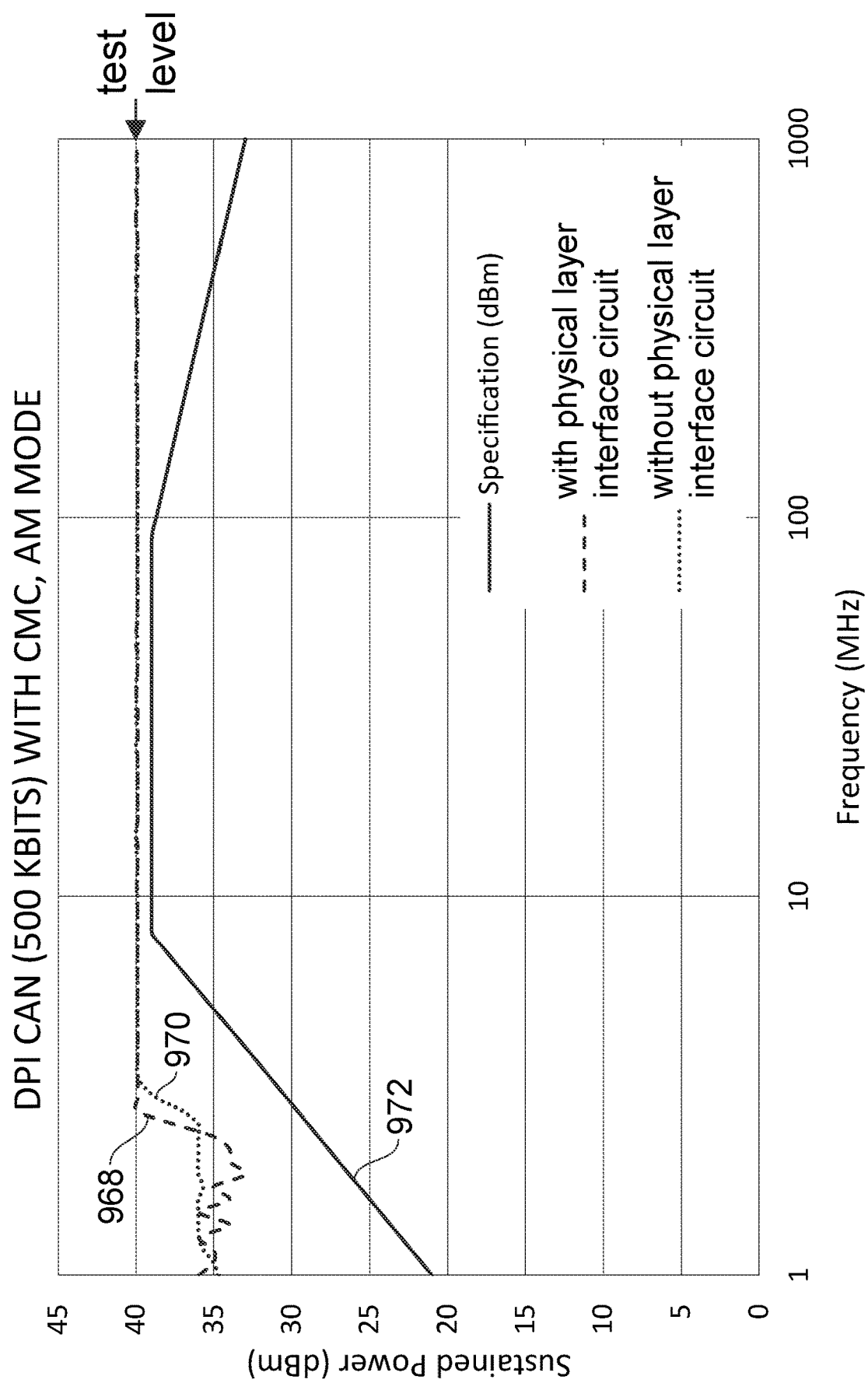
FIG. 9 shows DPI performance results of a two node 500 KB CAN bus physical layer with and without an optimised physical layer interface circuit according to an example embodiment, operating in AM mode, with CMCs.
Figure 10:
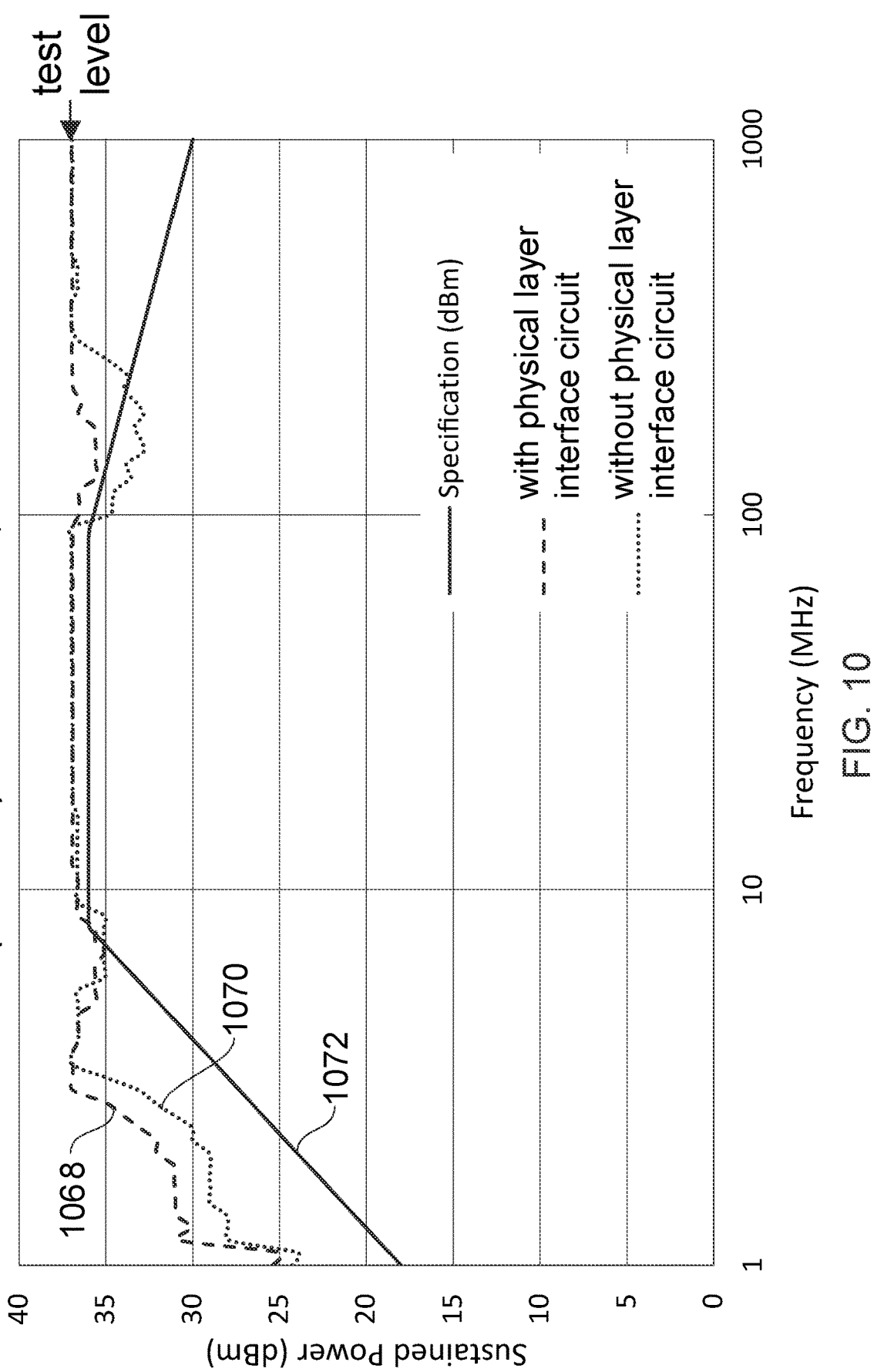
FIG. 10 shows DPI performance results of a two node 2 MB CAN bus physical layer with and without an optimised physical layer interface circuit according to an example embodiment, operating in CW mode, without CMCs.
Figure 11:
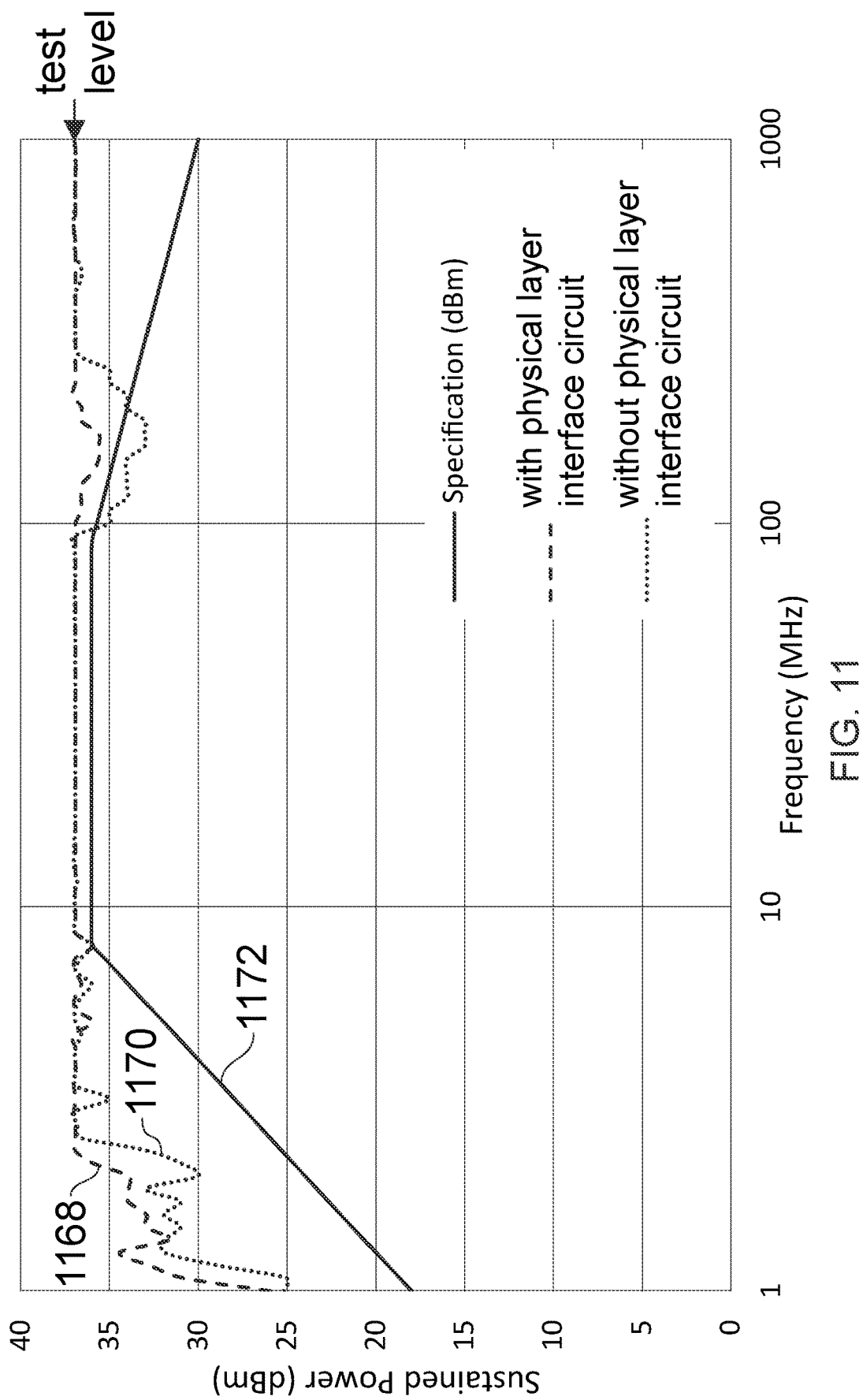
FIG. 11 shows DPI performance results of a two node 2 MB CAN bus physical layer with and without an optimised physical layer interface circuit according to an example embodiment, operating in AM mode, without CMCs.
Figure 12:
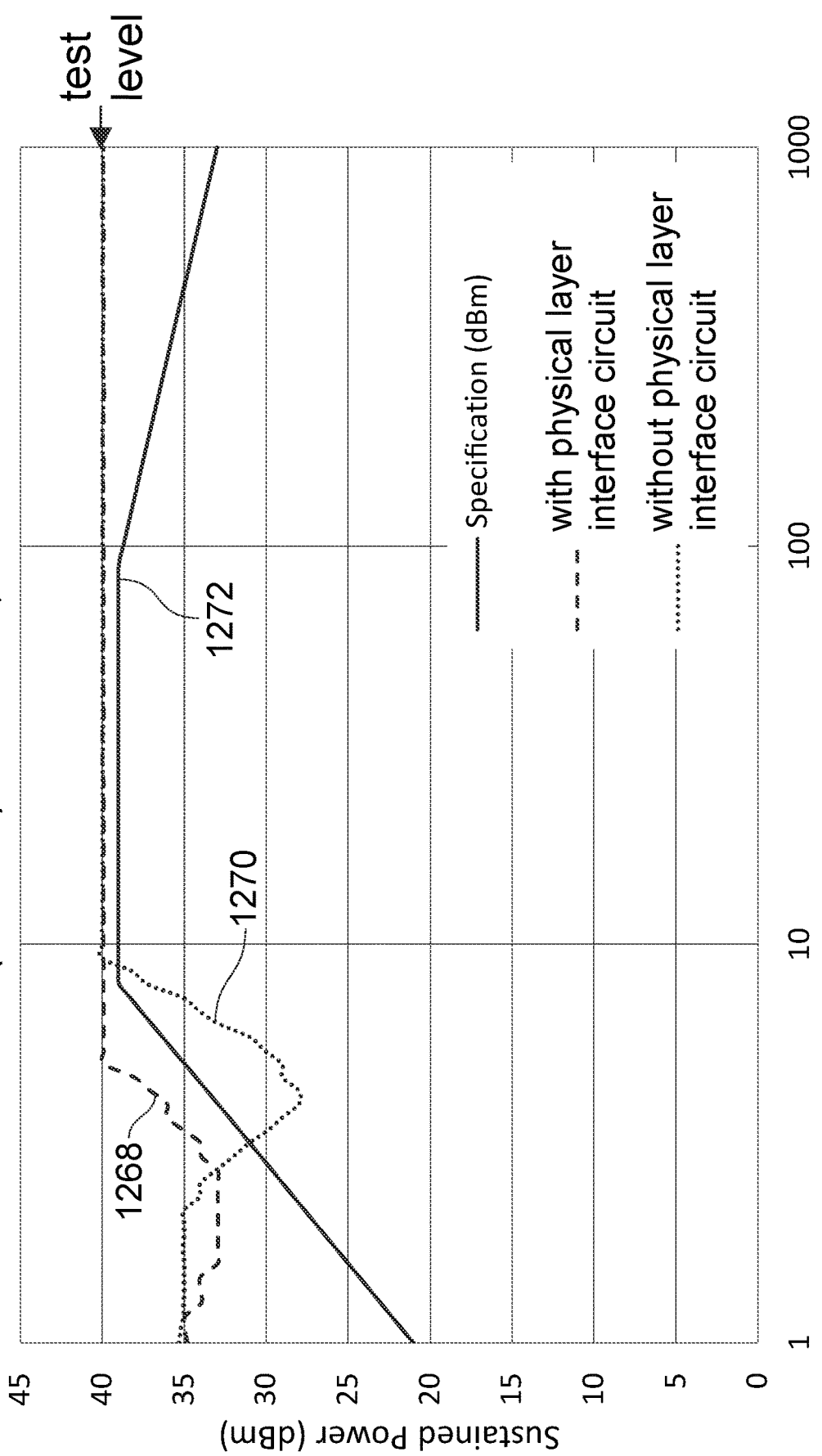
FIG. 12 shows DPI performance results of a two node 2 MB CAN bus physical layer with and without an optimised physical interface circuit according to an example embodiment, operating in CW mode, with CMCs.
Figure 13:
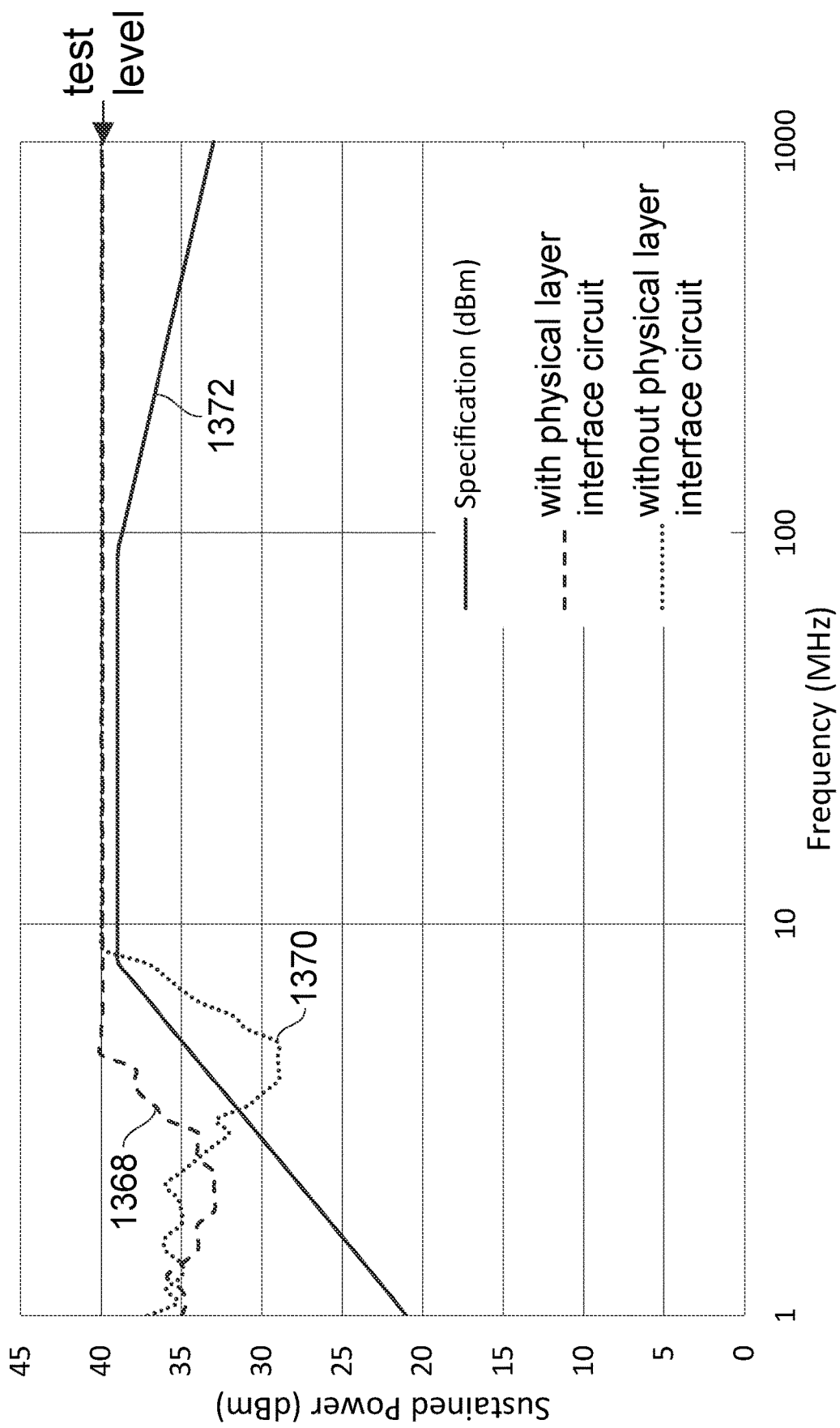
FIG. 13 shows DPI performance results of a two node 2 MB CAN bus physical layer with and without an optimised physical layer interface circuit according to an example embodiment, operating in AM mode, with CMCs.

| FIG. | Test Description | Test Mode | Without Interface Circuits | With Interface Circuits | Improvement |
|---|---|---|---|---|---|
| FIG. 6 | CAN 500 KB without CMC | CW | fail at high frequency around 300 MHz | pass | 4 dB |
| FIG. 7 | | AM | fail at high frequency around 300 MHz | pass | 4 dB |
| FIG. 8 | CAN 500 KB with CMC | CW | pass | pass | |
| FIG. 9 | | AM | pass | pass | |
| FIG. 10 | CAN FD 2 MB without CMC | CW | fail at high frequency around 300 MHz | pass | 4 dB |
| FIG. 11 | | AM | fail at high frequency around 300 MHz | pass | 4 dB |
| FIG. 12 | CAN FD 2 MB with CMC | CW | fail at low frequency around 4 MHz | pass | 8.5 dB |
| FIG. 13 | | AM | fail at low frequency around 4 MHz | pass | 8.5 dB |

FIG. 6 shows DPI results for a two-node 500 kbit CAN bus without CMCs operating in continuous wave (CW) mode. The plot shows a test level, a pass specification 672, an optimised curve 668 (showing results for CAN node ICs with a physical layer interface circuit) and an unoptimized curve 670 (showing results for CAN node ICs without a physical layer interface circuit). The CAN node ICs without a physical layer interface circuit fail the DPI test as the unoptimized curve 668 falls below the pass specification 672 at approximately 300 MHz. The optimised curve 670 remains above the pass specification 672 for all tested frequencies, indicating a test pass for the CAN node ICs with a physical layer interface circuit. The high frequency matching circuits correct the high frequency performance issue.

FIG. 7 shows DPI results for a two-node 500 kbit CAN bus without CMCs operating in amplitude modulation (AM) mode. The results are substantially the same as those for the CW mode described in relation to FIG. 6.

FIGS. 8 and 9 shows DPI results for a two-node 500 kbit CAN bus with CMCs operating in CW mode and AM mode respectively. Both the optimised curves 868, 968 and unoptimized curves 870, 970 remain above the pass specification 872, 972 for all frequencies indicating a test pass. However, reduced performance can be seen at 1 to 3 MHz for all performance curves.

FIGS. 10 and 11 show DPI results for a two-node 2 Mbit CAN bus without CMGs operating in CW mode and AM mode respectively. Both unoptimized curves 1070, 1170 fall below their respective pass specification 1072, 1172 at approximately 100-200 MHz indicating that the corresponding CAN node ICs without physical layer interface circuits fail the DPI test. The optimised curves 1070, 1170 remain above the pass specification 1072, 1172 for all frequencies, indicating a test pass for the CAN node ICs with a physical layer interface circuit. The high frequency matching circuits reduce the high frequency performance issue.

FIGS. 12 and 13 show DPI results for a two-node 2 Mbit CAN bus with CMCs operating in CW mode and AM mode respectively. Both unoptimized curves 1270, 1370 fall below their respective pass specification 1272, 1372 at approximately 3-6 MHz indicating that the corresponding CAN node ICs without physical layer interface circuits fail the DPI test. The optimised curves 1270, 1370 remain above the pass specification 1272, 1372 for all frequencies, indicating a test pass for the CAN node ICs with a physical layer interface circuit. The low frequency matching circuits reduce the low frequency performance issue. The shifting and reduction in quality factor of the low frequency resonance can be seen by comparing each unoptimized curves 1268, 1368 with the corresponding optimised curve 1270, 1370.

Table 1 indicates that inclusion of the physical layer interface circuits in the CAN node ICs addresses six failure modes of the equivalent ICs without the interface circuits.

FIGS. 6 to 13 illustrate that the performance issues are more severe for 2 Mbit CAN compared to 500 kBit CAN. The solution of the physical layer interface circuits will therefore help with the development of future differential bus networks with higher data rates of 5 MBits or 10 MBits.

Figure 14:
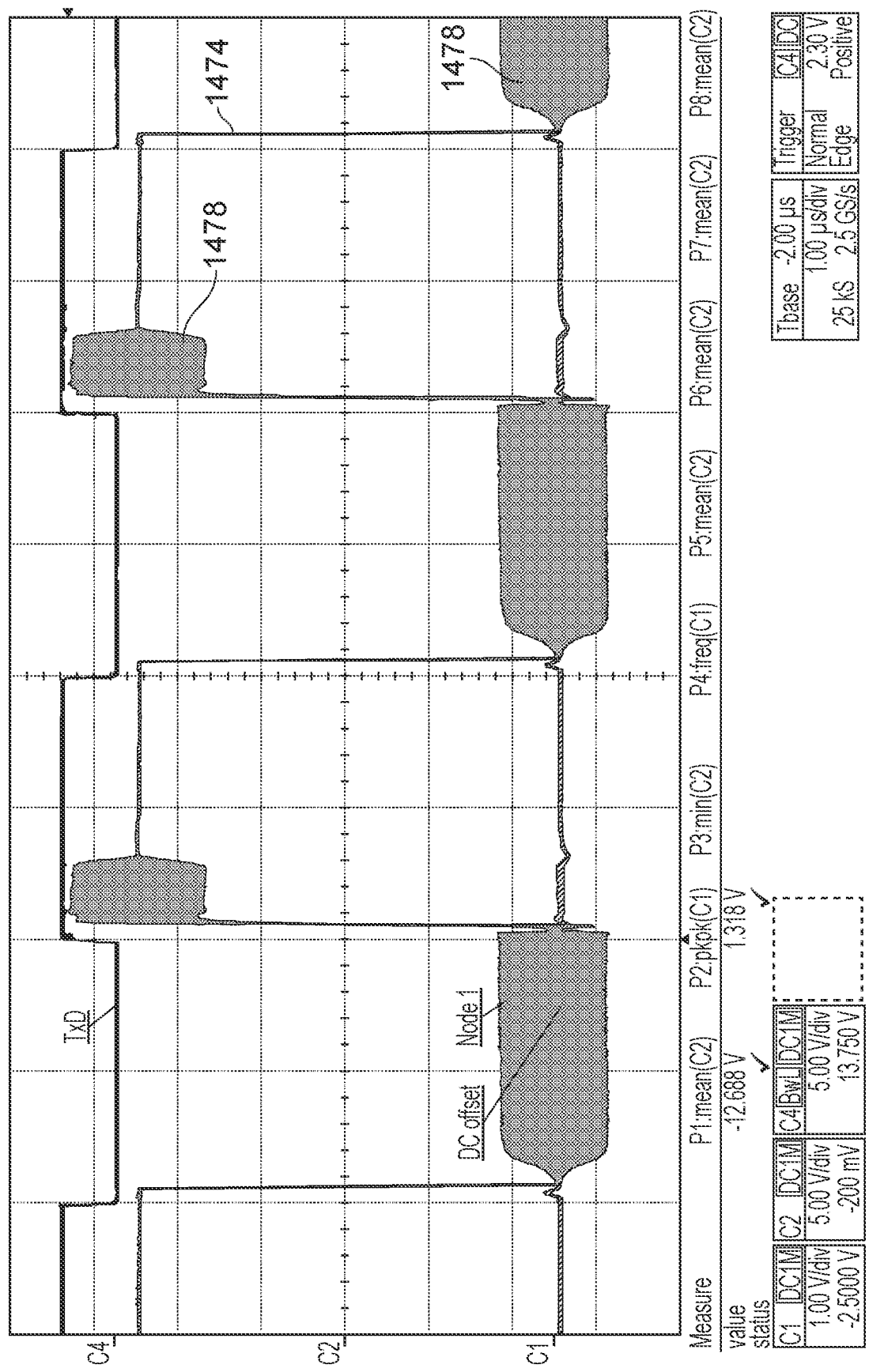
FIG. 14 illustrates undesirable oscillations in signals received by CAN bus nodes undergoing DPI testing according to IEC62228-3:2019.
Figure 14:
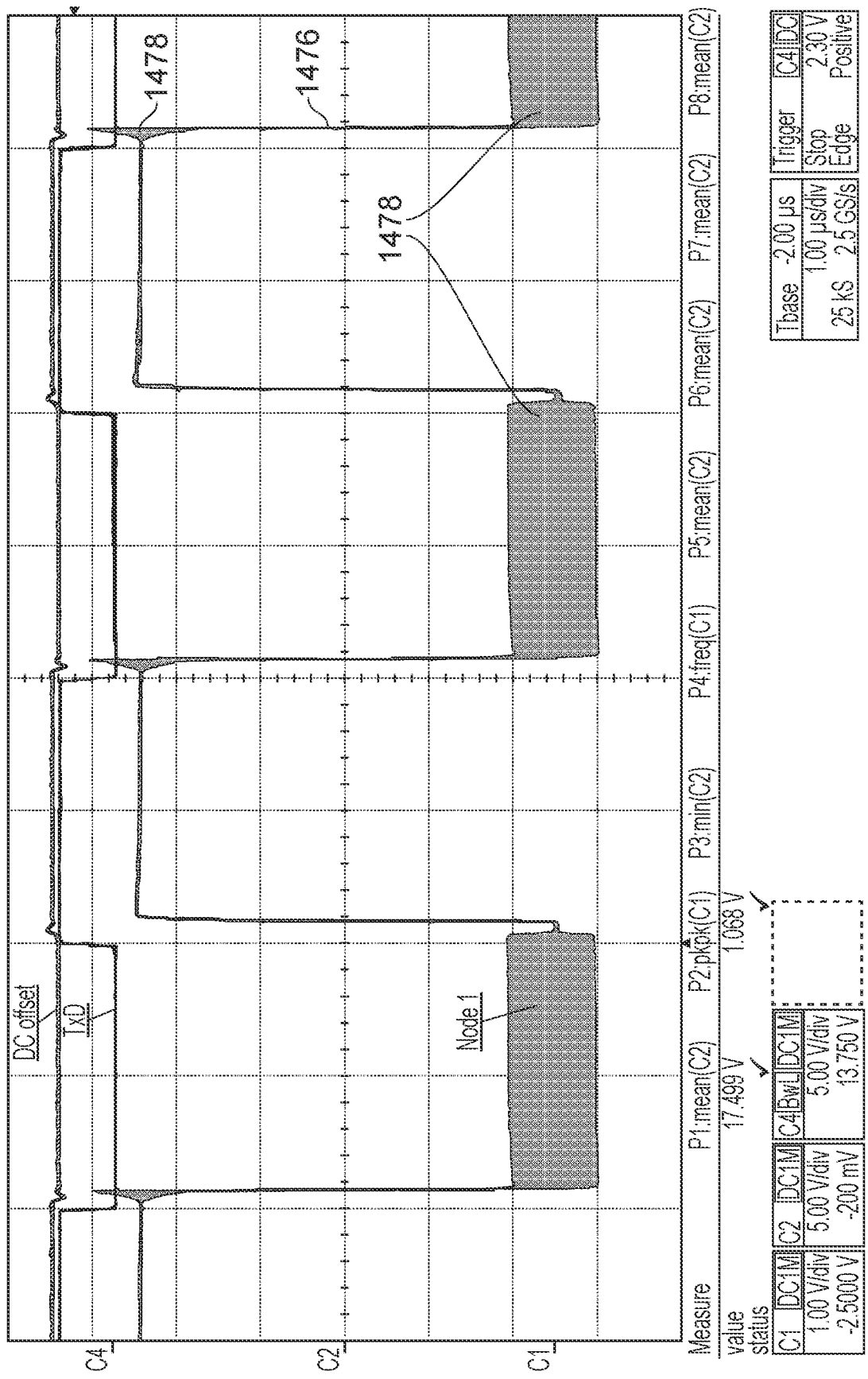

FIG. 14 illustrates an additional issue that can arise during DPI testing according to standard specification IEC62228-3:2019.

The figure illustrates: a first received signal 1474 received at a transceiver of one node in a first example two-node CAN bus undergoing DPI testing; and a second received signal 1476 received at a transceiver of one node in a second example two-node CAN bus undergoing DPI testing. The nodes in the two CAN buses comprise different ICs.

Both received signals comprise oscillations 1478, also known as RF bubbles, at the top and bottom levels of their cycles. The oscillations can occur below −5V and above +10V CAN offset (both DC and RF) in some examples. If a magnitude of the oscillation size becomes significant, the node transceiver may shut off due to self-induced RF.

With capacitive bus load, bubbles can nearly violate G5 requirements due to transceiver shutdown When occurring, bubbles can strongly violate G5 emission requirements on Vcc and Vio Oscillations may occur depending on the capacitance (to ground) that is located close to a node transceiver; one single transceiver may not oscillate by itself. Adding one or more transceivers locally can add enough capacitance for oscillations to occur. In addition, original equipment manufacturers (OEMs) may add CAN filter capacitances which can also result in oscillations. The oscillations 1478 can affect the ability of the node transceiver to correctly decode the received signal 1474, 1476.

Figure 15:
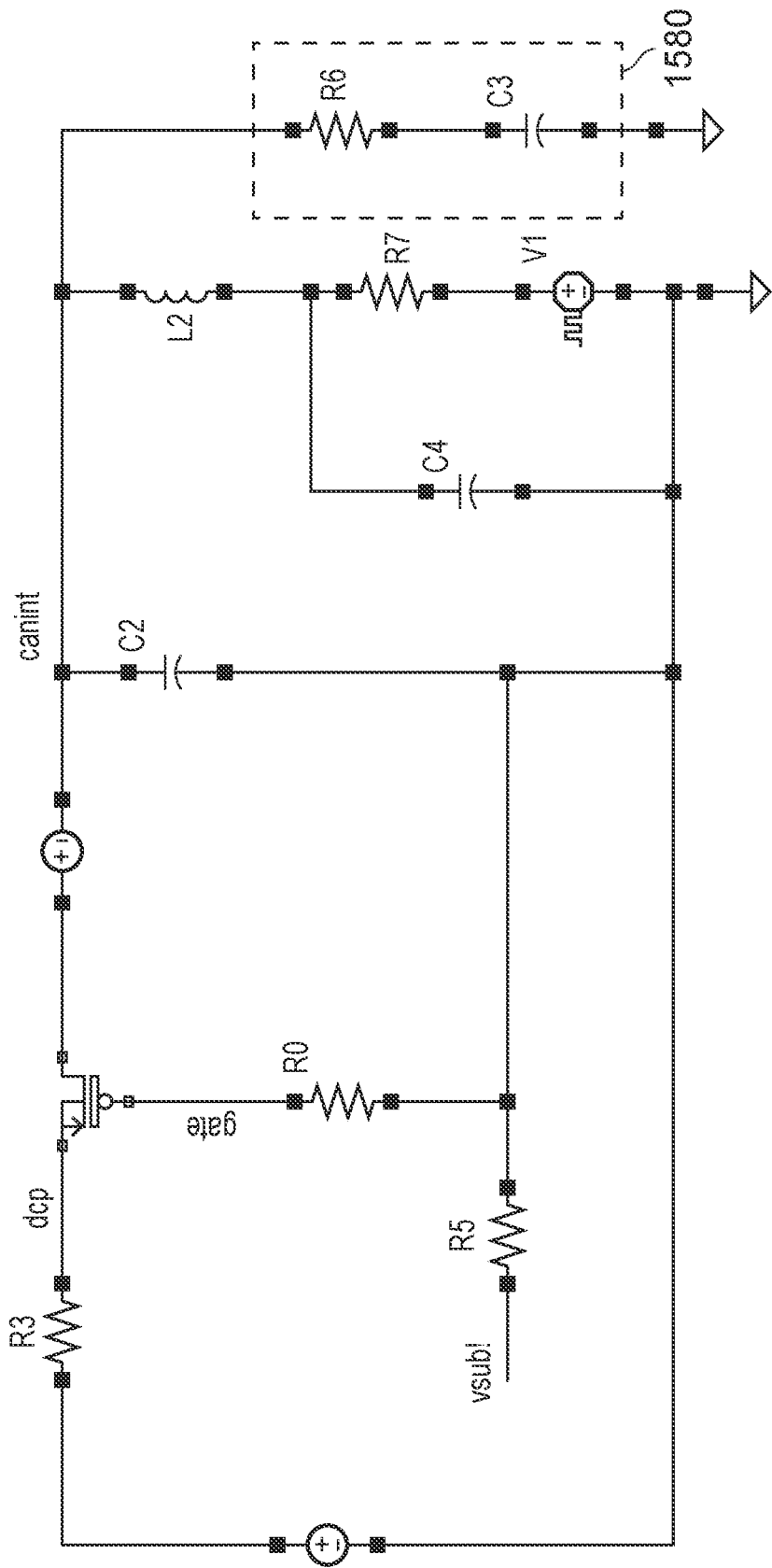
FIG. 15 illustrates a circuit setup for simulating the oscillations in the received signals of FIG. 14.

FIG. 15 illustrates a circuit setup for simulating the oscillations in the received signals of FIG. 14. The simulation includes a high frequency matching circuit 1580 of a physical layer interface circuit.

Figure 16:
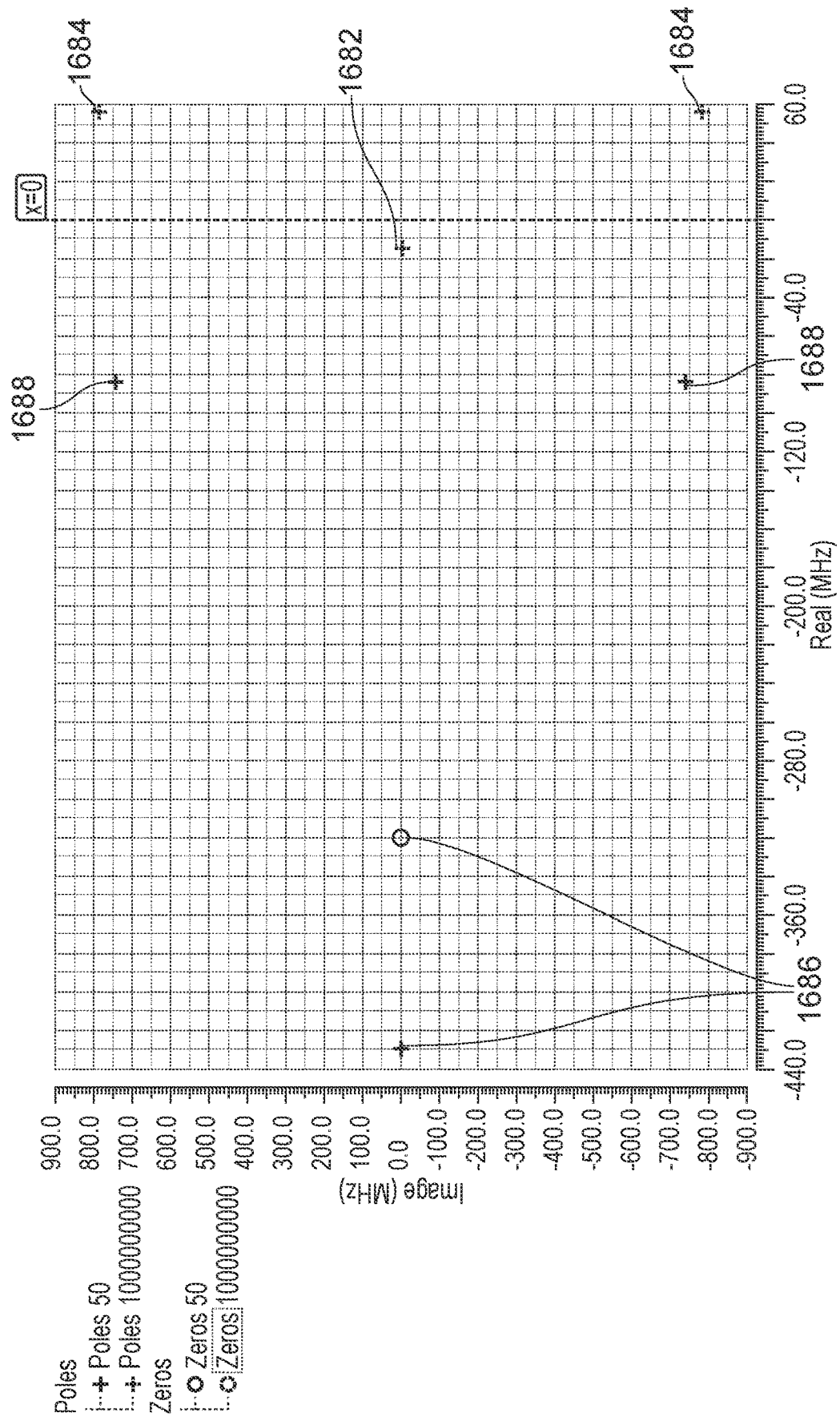
FIG. 16 illustrates a Nyquist Plot for the circuit of FIG. 15 with and without a physical layer interface circuit according to an example embodiment.

FIG. 16 illustrates a Nyquist Plot for the circuit of FIG. 15, for two different values of the resistor in the high frequency matching circuit. The plot shows one zero 1682 and two poles 1684 corresponding to a resistor value of 1000 MΩ. Such a high resistance value effectively simulates a circuit without a high frequency matching circuit. The plot also shows two zeros 1686 and two poles 1688 corresponding to a resistor value of 50Ω. For the 50Ω resistor, the system remains stable as the added zero prevents the poles 1588 shifting to the right-hand place (RHP) (Real (MHz) >0), where zeros and poles are unstable. This is a solution to damp the LC tank causing the oscillations (the inductance L can arise from parasitic sources such as PCB tracks and bond wires).

Figure 17:
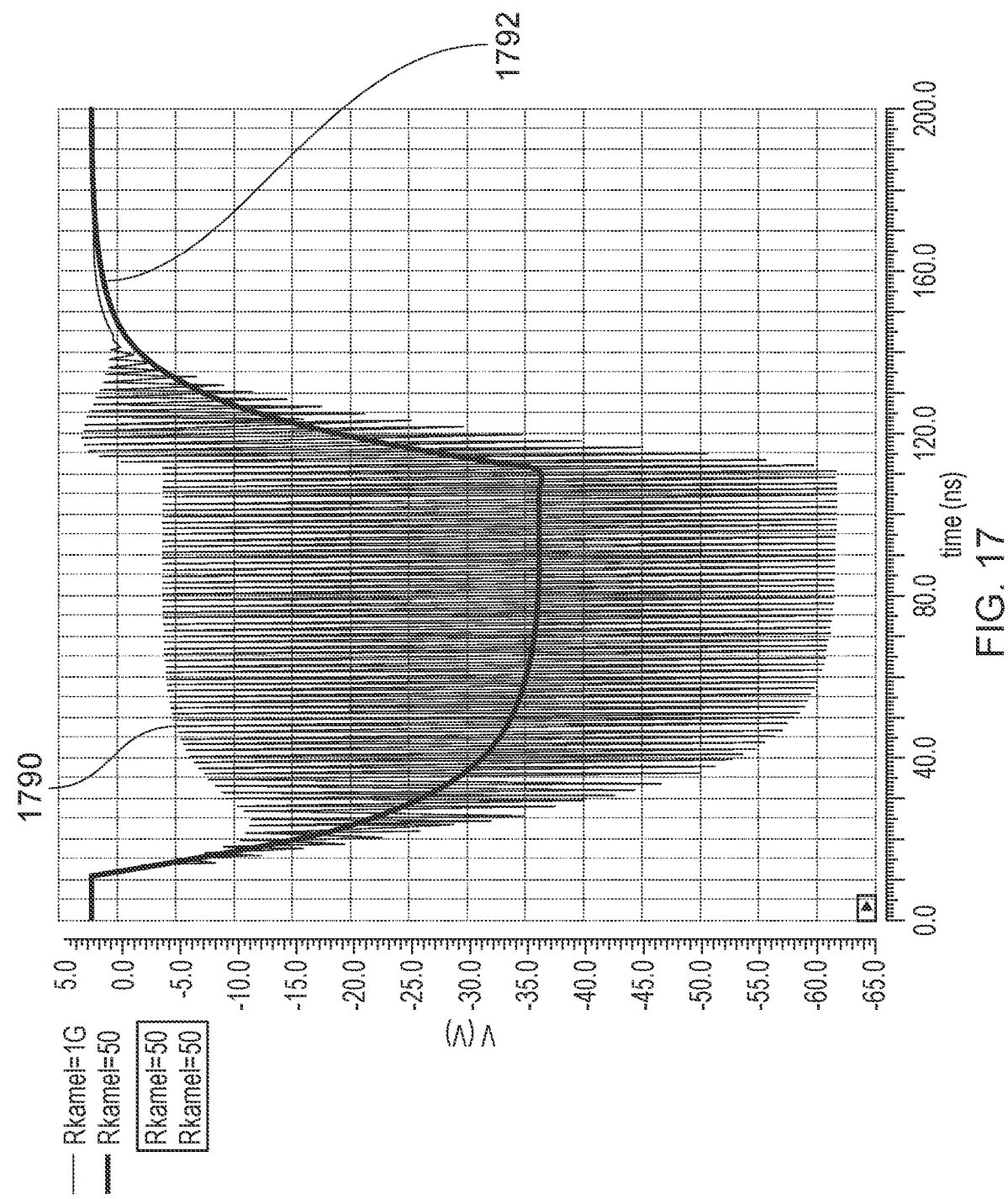
FIG. 17 illustrates a simulated received signal for the circuit of FIG. 15 with and without a physical layer interface circuit according to an example embodiment.

FIG. 17 illustrates a simulated received signal for the circuit of FIG. 15 with two different values of resistor (1000 MΩ and 50Ω) of the high frequency matching circuit. The 1000 MD resistance value effectively simulates no matching circuit and the corresponding simulated received signal 1790 has oscillations like those of FIG. 14. The simulated received signal 1792 for a 50Ω resistor in the matching circuit shows a damped variation and significant reduction in the oscillations.

The undesirable oscillations effectively increase the signal level at a given frequency. The oscillations can be particularly problematic at 550 MHz. The high frequency matching circuit can advantageously reduce these signal oscillations in addition to addressing the high frequency issue observed in a two node CAN bus test and illustrated in FIGS. 6, 7, 10 and 11. In this way, the resistance and capacitance values of the high frequency matching circuits may be selected based on reducing the high frequency performance issue for two-node network buses and received signal oscillations.

Figure 18:
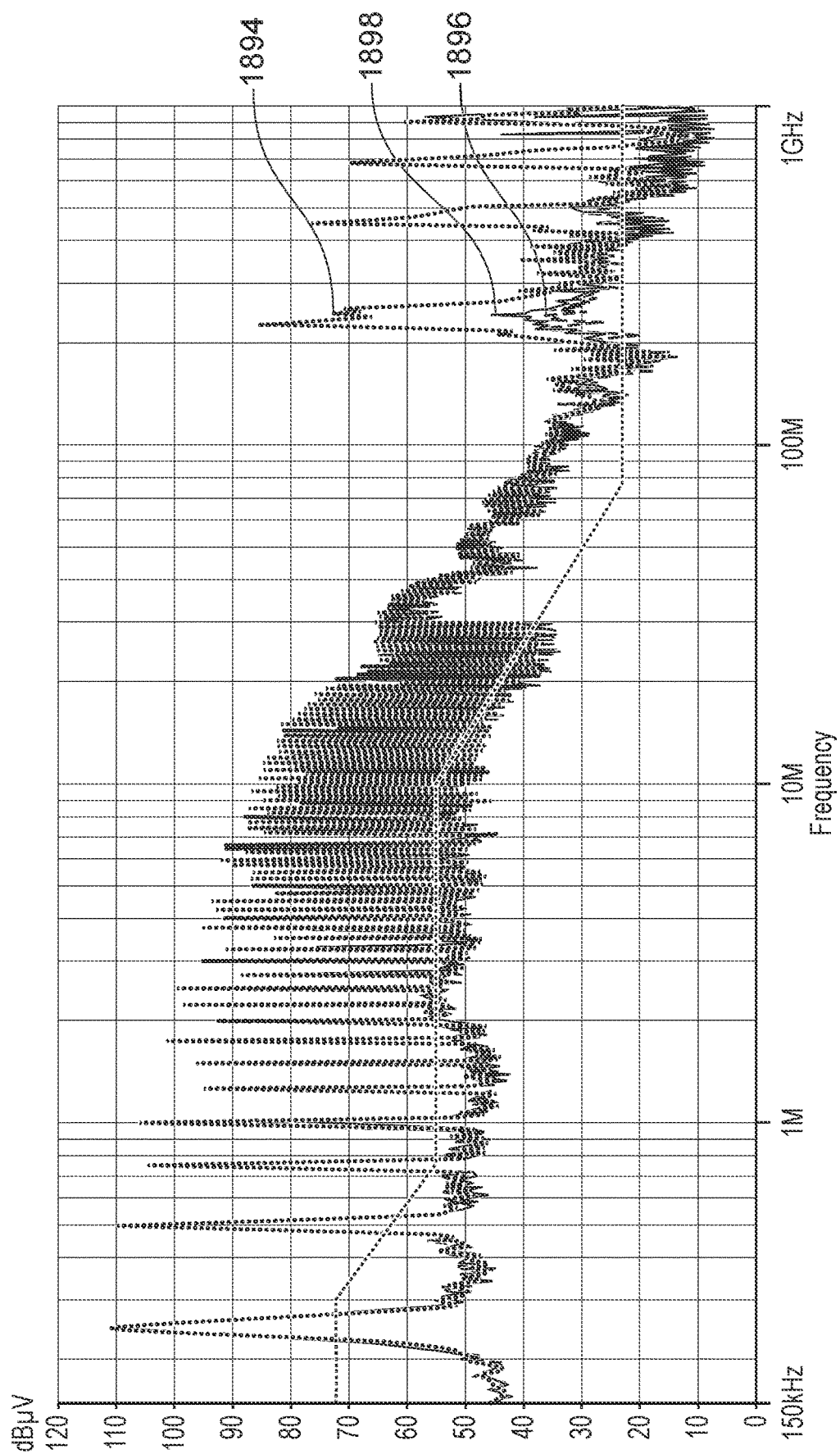
FIG. 18 illustrates the magnitude of the additional oscillating signal on a received signal at a CAN node in a two-node CAN bus undergoing DPI testing with and without a physical layer interface circuit according to an example embodiment.
Figure 18:
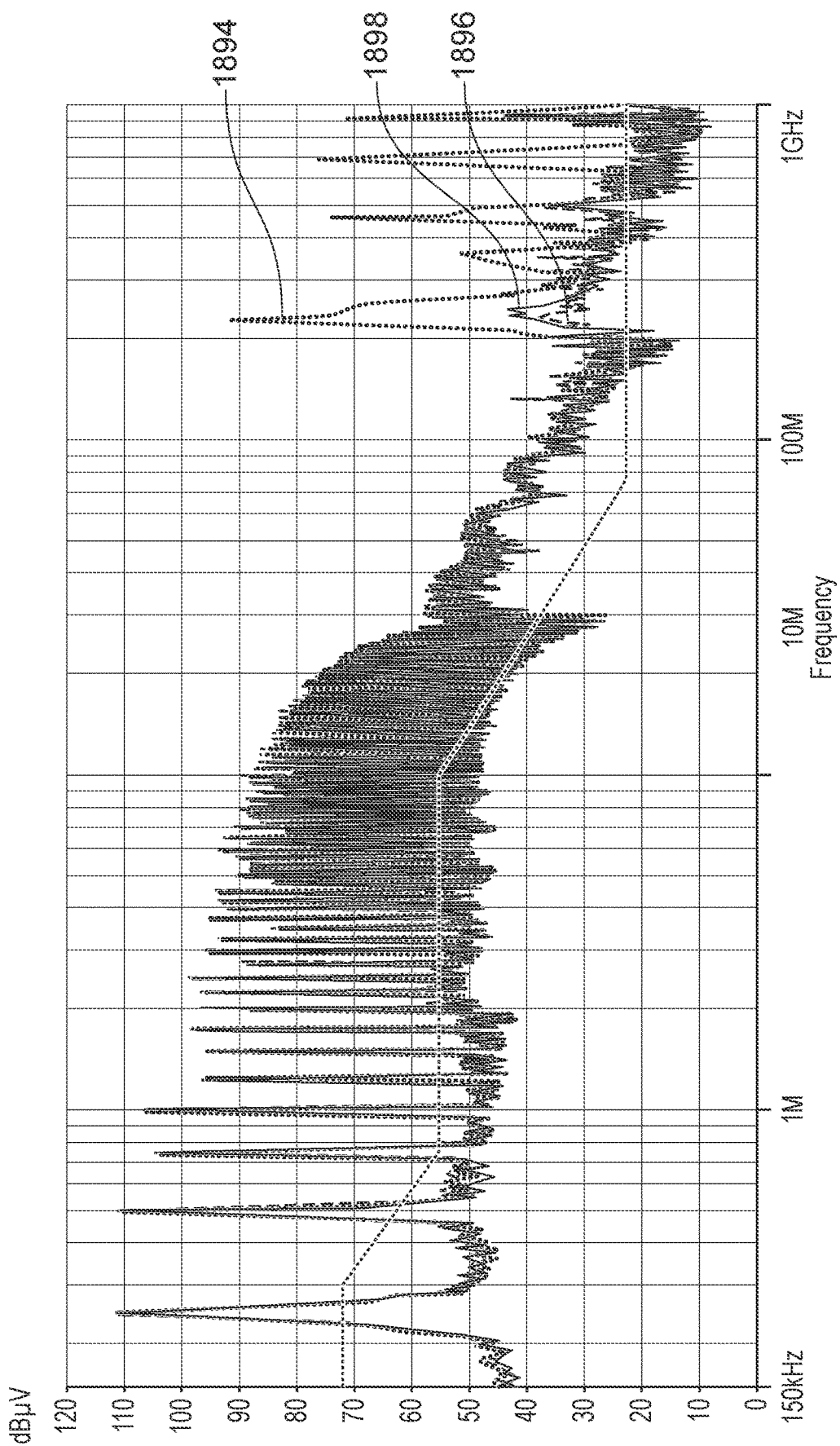

FIG. 18 illustrates the magnitude of the additional oscillating signal on a received signal at a CAN node in a two-node CAN bus undergoing DPI testing. The upper plot displays results for a common mode voltage of 15 V and the lower plot displays results for a common mode voltage of −15 V. Each plot shows the additional signal level for: (i) CAN bus nodes without physical layer interface circuits 1894; (ii) CAN bus nodes with physical layer interface circuits having first and second high frequency capacitors of 10 Pf 1896; and (iii) CAN bus nodes with physical layer interface circuits having first and second high frequency capacitors of 4 pF 1898. The physical layer interface circuits clearly reduce the additional signal level arising from the unwanted oscillations in the received signals at 100-1000 MHz. High frequency capacitors with a capacitance of 10 pF provide better performance than the 4 pF capacitors. However, the 4 pF capacitor performance is still sufficient and a 4 pF solution may be more attractive as it can consume less area on the die of the IC.

The disclosed physical layer interface circuits can be implemented using space on a pad ring of the IC and can improve immunity of the differential physical layers in both the low and high frequency domain. The interface circuits provide integrated matching networks that can be optimized to: (i) shift the low frequency resonance to lower frequencies while dumping its quality factor; and (ii) decrease high frequency impedance to decrease the level of power injected into the IC.

The physical layer interface circuits can improve the immunity performance of a physical layer using a common mode choke at low frequencies. At the same time, the interface circuit can improve the high frequency immunity of the IC when used without a common mode choke and when the network bus consists of only two nodes, as specified by the new standard specification IEC62228-3: 2019.

One major advantage of the disclosed physical layer interface circuits is that they can be simply implemented using the space on the PAD ring of the IC and connected to both inputs (or terminals) of differential physical layer. This can avoid increasing the die size of the IC and avoid big changes in IC architecture that fit specification for items outside EMC. In other words, the disclosed physical layer interface circuits can be implemented on existing IC designs without re-verification of the main transceiver and processing circuitry of the IC. Long cycle times of investigation (Measurement+Simulation) and addressing issues can also be avoided.

One or more of the integrated circuits disclosed herein address at least three problems faced with CAN and other differential networks (Distributed System Interface (DSI), FLEXRAY etc):
Low frequency issue with resonance between common mode choke and IC capacitance;
High frequency issue associated with decrease bus capacitance resulting from the two nodes configuration; and
The oscillations or RF bubbles issues observed at approximately 550 MHZ.

In this way, the physical layer interface circuit may be considered to form a resonance cleaner.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. An integrated circuit for use in a differential network bus node, the integrated circuit comprising:
a transceiver having a first transceiver input-output terminal and a second transceiver input-output terminal;
a physical layer high terminal connected to the first transceiver input-output-terminal;
a physical layer low terminal connected to the second transceiver input-output terminal; and
a physical layer interface circuit comprising:
a first low frequency RC matching circuit and a first high frequency RC matching circuit each connected between the first transceiver input-output-terminal and a first reference terminal; and
a second low frequency RC matching circuit and a second high frequency RC matching circuit each connected between the second transceiver input-output terminal and a second reference terminal.

2. The integrated circuit of claim 1 further comprising a pad ring, wherein the physical layer interface circuit is positioned within the pad ring.

3. The integrated circuit of claim 2, further comprising a processing circuit and a node controller, wherein the transceiver, the processing circuit and the node controller are not positioned within the PAD ring.

4. The integrated circuit of claim 1 wherein:
the physical layer high terminal is connected to the first transceiver input-output-terminal by:
a first bond wire connected between the physical layer high terminal and a first bond pad; and one or more first conductive paths connecting the first bond pad, the first transceiver input-output terminal and the first RC matching circuits; and the physical layer low terminal is connected to the second transceiver input-output-terminal by:

a second bond wire connected between the physical layer low terminal and a second bond pad; and one or more second conductive paths connecting the second bond pad, the second transceiver input-output terminal and the second RC matching circuits.

5. The integrated circuit of claim 1, wherein the first low frequency RC matching circuit is the same as the second low frequency RC matching circuit and the first high frequency matching circuit is the same as the second high frequency matching circuit.

6. The integrated circuit of claim 1 wherein:

the first low frequency RC matching circuit comprises a first low frequency resistor in series with a first low frequency capacitor;

the second low frequency RC matching circuit comprises a second low frequency resistor in series with a second low frequency capacitor;

the first high frequency RC matching circuit comprises a first high frequency resistor in series with a first high frequency capacitor; and the second high frequency RC matching circuit comprises a second high frequency resistor in series with a second high frequency capacitor.

7. The integrated circuit of claim 6 wherein:

the first low frequency resistor and the second low frequency resistor have values between 2 and 200 kOhms;

the first low frequency capacitor and the second low frequency capacitor have values between 1 and 5 pF;

the first high frequency resistor and the second high frequency resistor have values between 5 and 100 Ohms; and the first high frequency capacitor and the second high frequency capacitor have values between 1 and 10 pF.

8. The integrated circuit of claim 6, wherein the physical layer terminals are configured to be connected to an external common mode choke and a network bus.

9. The integrated circuit of claim 8 wherein:

an inductance of the common mode choke and a capacitance of the integrated circuit define a low frequency resonance; and values of the first low frequency resistor, the second low frequency resistor, the first low frequency capacitor and the second low frequency capacitor are based on the low frequency resonance.

10. The integrated circuit of claim 9, wherein the values of the first low frequency resistor and the second low frequency resistor are selected to reduce a quality factor of the low frequency resonance.

11. The integrated circuit of claim 9, wherein the values of the first low frequency capacitor and the second low frequency capacitor are selected to reduce a frequency of the low frequency resonance.

12. The integrated circuit of claim 6, wherein the values of the first high frequency resistor, the second high frequency resistor, the first high frequency capacitor and the second high frequency capacitor are selected to reduce RF oscillations.

13. The differential network bus node comprising the integrated circuit of claim 6.

14. The differential network bus node of claim 13 wherein the differential network bus node is one of:

a controller area network node;

a Flexray network node; or a distributed system interface (DSI) network node.

15. The differential network bus node of claim 13 further comprising a common mode choke, wherein:

an inductance of the common mode choke and a capacitance of the integrated circuit define a low frequency resonance; and values of the first low frequency resistor, the second low frequency resistor, the first low frequency capacitor and the second low frequency capacitor are based on the low frequency resonance.

* * * * *